US012635156B2

(12) United States Patent
Lee et al.

(10) Patent No.: US 12,635,156 B2
(45) Date of Patent: May 19, 2026

(54) SELF-ALIGNING PROCESS METHOD AND SELF-ALIGNING PROCESS APPARATUS FOR REDUCING CRITICAL DIMENSION VARIATION OF SiC TRENCH GATE MOSFET STRUCTURE

(71) Applicant: PUSAN NATIONAL UNIVERSITY INDUSTRY—UNIVERSITY COOPERATION FOUNDATION, Busan (KR)

(72) Inventors: Ho Jun Lee, Busan (KR); Jee Hun Jeong, Cheonan-si (KR); Sang Woo Kim, Pohang-si (KR); Min Seok Jang, Busan (KR); O Gyun Seok, Busan (KR)

(73) Assignee: PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 621 days.

(21) Appl. No.: 18/022,988

(22) PCT Filed: Jul. 15, 2021

(86) PCT No.: PCT/KR2021/009082
§ 371 (c)(1),
(2) Date: Feb. 24, 2023

(87) PCT Pub. No.: WO2022/045582
PCT Pub. Date: Mar. 3, 2022

(65) Prior Publication Data
US 2023/0326992 A1     Oct. 12, 2023

(30) Foreign Application Priority Data
Aug. 28, 2020    (KR) ........................ 10-2020-0108957

(51) Int. Cl.
*H10D 12/01*      (2025.01)
*H10D 62/832*     (2025.01)
(Continued)

(52) U.S. Cl.
CPC ....... *H10D 12/031* (2025.01); *H10D 62/8325* (2025.01); *H10P 30/22* (2026.01); *H10P 95/062* (2026.01)

(58) Field of Classification Search
CPC .. H01L 21/266; H10D 12/038; H10D 12/461; H10D 12/481; H10D 30/0297;
(Continued)

(56) References Cited

U.S. PATENT DOCUMENTS

| | | | | |
|---|---|---|---|---|
| 5,514,616 A | * | 5/1996 | Rostoker | .............. H10D 84/038 438/723 |
| 6,526,547 B2 | * | 2/2003 | Breiner | ............... G03F 7/70625 716/56 |

(Continued)

FOREIGN PATENT DOCUMENTS

| | | |
|---|---|---|
| JP | 201369854 A | 4/2013 |
| KR | 1020070032627 A | 3/2007 |

(Continued)

OTHER PUBLICATIONS

International Search Report mailed Nov. 15, 2021 for PCT/KR2021/009082.

*Primary Examiner* — Eric A. Ward
(74) *Attorney, Agent, or Firm* — CANTOR COLBURN LLP

(57)            ABSTRACT
A self-aligning process method and a self-aligning process apparatus for reducing critical dimension variation of a SiC trench gate MOSFET structure are disclosed.

14 Claims, 21 Drawing Sheets

(51) Int. Cl.
    *H10P 30/22*     (2026.01)
    *H10P 95/00*     (2026.01)
(58) Field of Classification Search
    CPC .. H10D 30/655; H10D 30/665; H10D 30/668;
                   H10D 62/8325; H10D 64/513
    See application file for complete search history.

(56)           References Cited

U.S. PATENT DOCUMENTS

| | | | |
|---|---|---|---|
| 2002/0160573 A1 | 10/2002 | Peake et al. | |
| 2013/0344667 A1 | 12/2013 | Qin et al. | |
| 2018/0204906 A1* | 7/2018 | Okada .................. | H10D 62/107 |
| 2019/0354089 A1* | 11/2019 | Wang ................. | G05B 19/4187 |
| 2020/0105529 A1* | 4/2020 | Ghandi ............. | H10D 62/8325 |

FOREIGN PATENT DOCUMENTS

| | | |
|---|---|---|
| KR | 1020120003019 A | 1/2012 |
| KR | 1020140091956 A | 7/2014 |
| KR | 1020160008741 A | 1/2016 |
| KR | 101685572 B1 | 12/2016 |
| KR | 101961235 B1 | 3/2019 |

* cited by examiner

Oxide (i)

(ii)

SELF-ALIGNING PROCESS METHOD AND SELF-ALIGNING PROCESS APPARATUS FOR REDUCING CRITICAL DIMENSION VARIATION OF SiC TRENCH GATE MOSFET STRUCTURE

TECHNICAL FIELD

The present disclosure relates to a self-aligning processing method and a self-aligning processing device for reducing critical dimension variation occurring through a photo process during a manufacturing process of a metal-oxide-semiconductor field-effect transistor (MOSFET) in a trench gate structure.

More particularly, herein, by using two dielectric materials having different selectivities, which are silicon dioxide (SiO$_2$) and silicon nitride (an SiN layer), the self-aligning processing method and the self-aligning processing device are provided for reducing critical dimension variation of a SiC trench gate MOSFET structure that may reduce line-width variation in the formation of a p+ region, an n+ region, and a trench in an active region.

BACKGROUND ART

A photo process has been essentially used to form a p+ region, an n+ region, and a trench in a trench gate metal-oxide-semiconductor field-effect transistor (MOSFET) structure. The photo process may be performed by depositing photoresist on a surface of a wafer and patterning in the length of a desired region through UV beam and developer processes.

The photo process may cause line-width variation by the width and viscosity of photoresist, an exposure time, an optical reaction, corrosion of photoresist during an etching process, an etching process time, an etching ratio, and the like.

The line-width variation may cause critical misalignment in designing a device using multiple masks and due to the critical misalignment, a problem of production of a device that is different from an initial device design plan may occur.

Accordingly, there is a demand for an improved method of reducing line-width variation in the formation of a p+ region, an n+ region, and a trench in an active region.

Disclosure of the Invention

Technical Goals

Example embodiments of the present disclosure provide a self-aligning processing method and a self-aligning processing device for reducing critical dimension variation of a SiC trench gate metal-oxide-semiconductor field-effect transistor (MOSFET) structure that may significantly reduce line-width variation ($\Delta$CD) using two dielectric materials, which are silicon dioxide (SiO$_2$) and silicon nitride (a SiN layer).

In addition, example embodiments of the present disclosure provide a self-aligning processing model using two dielectric materials having different selectivities to reduce line-width variation ($\Delta$CD).

Technical Solutions

According to an aspect, there is provided a self-aligning processing method of reducing critical dimension variation of a SiC trench gate metal-oxide-semiconductor field-effect transistor (MOSFET) structure including forming at least a portion of a SiO2 layer on a substrate as a P well, forming a p+ layer by injecting P+ ions into a first region of the P well, after forming the p+ layer, planarizing a SiN layer after depositing the SiN layer on an entirety of the P well, forming an n+ layer by injecting n+ ions into a second region of the P well on which the SiN layer is deposited, after forming the n+ layer, planarizing an oxide layer after depositing the oxide layer on the entirety of the P well, forming a trench on the P well on which the oxide layer is deposited, and forming a bottom protection well and a gate on the trench.

In addition, according to another aspect, there is provided a self-aligning processing method of reducing critical dimension variation of a SiC trench gate MOSFET structure including forming at least a portion of a SiO2 layer on a substrate as a P well, forming an n+ layer by injecting n+ ions into a second region of the P well, after forming the n+ layer, planarizing a first SiN layer after depositing the first SiN layer on an entirety of the P well, forming a p+ layer by injecting p+ ions into a first region of the P well on which the first SiN layer is deposited, after forming the p+ layer, planarizing a second SiN layer after depositing the second SiN layer on the entirety of the P well, after forming a trench in the P well on which the second SiN layer is deposited, removing photoresist, and forming a bottom protection well and a gate in the trench.

In addition, according to another aspect, there is provided a self-aligning processing device for reducing critical dimension variation of a SiC trench gate MOSFET structure including a forming unit configured to form at least a portion of a SiO$_2$ layer on a substrate as a P well and form a p+ layer by injecting P+ ions into a first region of the P well, a deposition unit configured to planarize a SiN layer after depositing the SiN layer on an entirety of the P well after forming the p+ layer, wherein the forming unit is configured to form an n+ layer by injecting n+ ions into a second region of the P well on which the SiN layer is deposited, and as the deposition unit planarizes an oxide layer after depositing the oxide layer on the entirety of the P well after forming the n+ layer, form a trench in the P well on which the oxide layer is deposited and form a bottom protection well and a gate in the trench.

In addition, according to another aspect, there is provided a self-aligning processing device for reducing critical dimension variation of a SiC trench gate MOSFET structure including a forming unit configured to form at least a portion of a SiO$_2$ layer on a substrate as a P well and form an n+ layer by injecting n+ ions into a second region of the P well, a deposition unit configured to planarize a first SiN layer after depositing the first SiN layer on an entirety of the P well after forming the n+ layer, wherein the forming unit is configured to form a p+ layer by injecting p+ ions into a first region of the P well on which the first SiN layer is deposited, and as the deposition unit planarizes a second SiN layer after depositing the second SiN layer on the entirety of the P well after forming the p+ layer, form a trench in the P well on which the second SiN layer is deposited and form a bottom protection well and a gate in the trench.

Effects

According to an example embodiment, a self-aligning processing method and a self-aligning processing device for reducing critical dimension variation of a SiC trench gate MOSFET structure which may significantly reduce line-width variation ($\Delta$CD) using two dielectrics, which are silicon dioxide (SiO$_2$) and silicon nitride (e.g., a SiN layer), may be provided.

In addition, according to an example embodiment, a self-aligning processing model using two dielectric materials having different selectivities to reduce the line-width variation (ΔCD) may be provided.

BEST MODE FOR CARRYING OUT THE INVENTION

Figure 1:
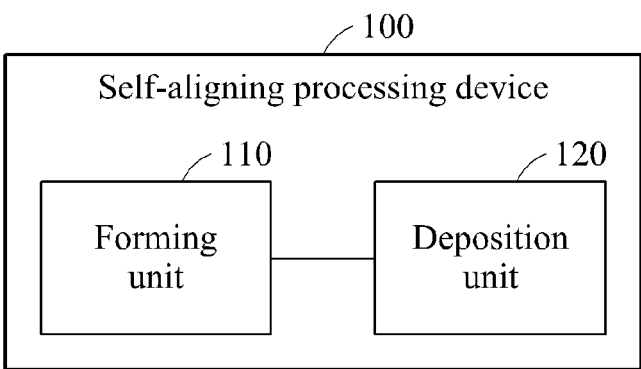
FIG. 1 is a block diagram illustrating a configuration of a self-aligning processing device to reduce critical dimension variation of a SiC trench gate metal-oxide-semiconductor field-effect transistor (MOSFET) structure.

Hereinafter, example embodiments will be described in detail with reference to the accompanying drawings. However, various alterations and modifications may be made to the example embodiments. Here, the example embodiments are not construed as limited to the disclosure. The example embodiments should be understood to include all changes, equivalents, and replacements within the idea and the technical scope of the disclosure.

The terminology used herein is for the purpose of describing particular example embodiments only and is not to be limiting of the example embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

FIG. 1 is a block diagram illustrating a configuration of a self-aligning processing device to reduce critical dimension variation of a SiC trench gate metal-oxide-semiconductor field-effect transistor (MOSFET) structure.

Referring to FIG. 1, a self-aligning processing device (hereinafter, referred to as a "self-aligning processing device") 100 for reducing critical dimension variation of a SiC trench gate MOSFET structure may include a forming unit 110 and a deposition unit 120.

Firstly, the forming unit 110 may form at least a portion of a $SiO_2$ layer on a substrate into a P well. That is, the forming unit 110 may serve to form a P type area by injecting p-ions into a predetermined region in a produced n type substrate.

In addition, the forming unit 110 may form a p+ layer by injecting P+ ions into a first region of the P well. That is, the forming unit 110 may serve to determine a P+ active region by injecting ions to form a P+ layer into a portion of the P well. In this case, the forming unit 110 may cause an oxide layer to remain in a second region of the P well. The second region may be a region different from the first region in the P well although the second region adjoins and contacts the first region.

After forming the p+ layer, the deposition unit 120 may deposit a silicon nitride (SiN) layer on the entire P well. That is, the deposition unit 120 may serve to deposit the SiN layer by covering an upper end of the P well, in which the P+ layer is formed as the first region and the oxide layer is formed as the second region, with the SiN layer.

In addition, the deposition unit 120 may prevent the oxide layer from being covered with the SiN layer by planarizing the deposited SiN layer based on the upper end of the oxide layer remaining in the second region in a process of forming the p+ layer. That is, the deposition unit 120 may cause the deposited SiN layer to remain only in the first region based on the upper end of the oxide layer for planarizing the covering SiN layer.

Thereafter, the forming unit 110 may form an n+ layer by injecting n+ ions into the second region of the P well on which the SiN layer is deposited.

To form the n+ layer, the forming unit 110 may apply photoresist to the entire P well on which the SiN layer is deposited. That is, the forming unit 110 may apply photoresist to the entire upper end of the P well in which the P+ layer and the SiN layer are formed as the first region and the oxide layer is formed as the second region.

Thereafter, the forming unit 110 may form a pattern for the second region by exposure and a developer. That is, the forming unit 110 may remove photoresist applied to the second region and may pattern to expose the oxide layer.

In addition, the forming unit 110 may remove the oxide layer by using a pattern in a wet or dry etching process. That is, the forming unit 110 may etch the oxide layer in the second region and a portion of the P well under the oxide layer based on a designed pattern.

In this case, wet etching may be a method of etching an oxide layer through a chemical reaction using a hydrofluoric (HF) solution. In addition, dry etching may be a method of etching an oxide layer through chemical and physical reactions using plasma.

After the oxide layer of the second region is removed, the forming unit 110 may etch the SiN layer of the first region in a trimming process. That is, the forming unit 110 may cause the first region to overlap with the second region.

In this case, the trimming process may be an isotropic etching process using physical and chemical reactions using a chemical reaction using a solution or plasma.

In addition, the forming unit 110 may form the n+ layer by injecting the n+ ions into the second region from which the oxide layer is removed. That is, the forming unit 110 may determine an n+ active region by injecting ions to form the n+ layer into the second region that is a different portion of the P well.

Thereafter, the forming unit 110 may remove photoresist remaining in the first region.

Through this, the self-aligning processing device 100 may provide the P well in which the P+ layer and the SiN layer are formed as the first region and the n+ layer is formed as the second region.

In another example embodiment of forming the n+ layer, the forming unit 110 may sequentially apply an oxide layer and photoresist to the entire P well on which the SiN layer is deposited. That is, the forming unit 110 may continuously apply the oxide layer and photoresist to the entire upper end of the P well in which the P+ layer and the SiN layer are formed as the first region and the oxide layer is formed as the second region. Accordingly, in the second region, a structure in which the oxide layer remaining in the second region and an additional oxide layer are stacked in a process of forming the p+ layer may be formed.

Thereafter, the forming unit 110 may form a pattern for the second region by exposure and a developer. That is, the forming unit 110 may remove photoresist applied to the second region and may pattern to expose the oxide layer.

In addition, the forming unit 110 may remove the oxide layer by using a wet or dry etching process based on the pattern. That is, the forming unit 110 may etch the oxide layer in the second region and a portion of the P well under the oxide layer based on a designed pattern.

After the oxide layer of the second region is removed, the forming unit 110 may perform a trimming etching process using a chemical reaction or plasma on the SiN layer of the first region.

In addition, the forming unit 110 may form the n+ layer by injecting the n+ ions into the second region from which the oxide layer is removed. That is, the forming unit 110 may determine an n+ active region by injecting ions to form the n+ layer into the second region that is a different portion of the P well.

Thereafter, the forming unit 110 may remove photoresist remaining in the first region.

Through this, the self-aligning processing device 100 may provide the P well in which the P+ layer and the SiN layer are formed as the first region and the n+ layer is formed as the second region.

In addition, the deposition unit 120 may deposit an oxide layer on the entire P well after forming the n+ layer. That is, the deposition unit 120 may deposit the oxide layer by covering an upper end of the P well, in which the P+ layer and the SiN layer are formed as the first region and the n+ layer is formed as the second region, with the oxide layer.

In addition, for the second region, the deposition unit 120 may cause the oxide layer to remain on the n+ layer by planarizing the deposited oxide layer based on the upper end of the SiN layer formed in the first region. That is, the deposition unit 120 may cause the deposited oxide layer to remain only in the second region based on the upper end of the SiN layer for planarizing the covering oxide layer.

In addition, the forming unit 110 may form a trench on the P well on which the oxide layer is deposited. The trench may raise a degree of integration by arranging a cell in a space formed by excavating a surface of a semiconductor chip.

To form the trench, the forming unit 110 may apply photoresist to the entire P well. That is, the forming unit 110 may apply photoresist to the entire upper end of the P well in which the P+ layer and the SiN layer are formed as the first region and the n+ layer and the oxide layer are formed as the second region.

Thereafter, the forming unit 110 may form a pattern for the first region in which the trench is formed by exposure and a developer. That is, the forming unit 110 may remove photoresist applied to a portion of the first region that is designed to include a trench and may pattern to expose the SiN layer under the first region.

In addition, the forming unit 110 may form the trench by removing the SiN layer of the first region by using a wet or dry etching process based on the pattern.

That is, the forming unit 110 may etch the SiN layer on a portion of the first region based on the designed pattern.

In addition, after the SiN layer of the first region is removed, the forming unit 110 may form the trench by removing a portion of the oxide layer of the second region by using a trimming etching process.

That is, the forming unit 110 may etch the SiN layer of the portion of the first region and the oxide layer of the second region based on the designed pattern.

In this case, wet etching may be a method of etching a SiN layer through a chemical reaction using $H_3PO_4$ (e.g., a phosphoric acid solution). In addition, dry etching may be a method of etching an oxide layer through chemical and physical reactions using plasma.

Thereafter, the forming unit 110 may remove remaining photoresist.

Through this, the self-aligning processing device 100 may provide a P well in which a P+ layer including a trench in a portion of a first region is formed.

In another example embodiment of forming the trench, the forming unit 110 may sequentially apply a SiN layer and photoresist to the entire P well. That is, the forming unit 110 may continuously apply the SiN layer and photoresist to the entire upper end of the P well in which the P+ layer and the SiN layer are formed as the first region and the n+ layer and the oxide layer are formed as the second region.

Accordingly, the first region may include a structure in which the existing SiN layer covering the p+ layer and an additional SiN layer are stacked.

Thereafter, the forming unit 110 may form a pattern for the first region in which the trench is formed by exposure and a developer. That is, the forming unit 110 may remove photoresist applied to a portion of the first region that is designed to include a trench and may pattern to expose the SiN layer stacked under the first region.

In addition, the forming unit 110 may form the trench by removing the SiN layer of the first region by using a wet or dry etching process based on the pattern.

In addition, after the SiN layer of the first region is removed, the forming unit 110 may form the trench by removing a portion of the oxide layer of the second region by using a trimming etching process.

In this case, the trimming process may be an isotropic etching process using physical and chemical reactions using a chemical reaction using a solution or plasma.

Thereafter, the forming unit 110 may remove remaining photoresist.

In addition, the forming unit 110 may form a bottom protection well (BPW) and a gate in the trench. That is, the forming unit 110 may complete a SiC trench gate MOSFET by providing the BPW and the gate through the formed trench.

According to an example embodiment, a self-aligning processing method and a self-aligning processing device for reducing critical dimension variation of a SiC trench gate MOSFET structure which may significantly reduce line-width variation ($\Delta$CD) using two dielectrics of $SiO_2$ and silicon nitride (e.g., a SiN layer) may be provided.

In addition, according to an example embodiment, a self-aligning processing model using two dielectric materials having different selectivities to reduce the line-width variation ($\Delta$CD) may be provided.

Hereinafter, the self-aligning processing device according to another example embodiment is described.

The forming unit 110 may form at least a portion of a $SiO_2$ layer on a substrate into a P well. That is, the forming unit 110 may serve to form a P type area by injecting p-ions into a predetermined region in a produced n type substrate.

In addition, the forming unit 110 may form an n+ layer by injecting n+ ions into a second region of the P well. That is, the forming unit 110 may serve to determine an n+ active region by injecting ions to form an n+ layer into a portion of the P well. In this case, the forming unit 110 may cause an oxide layer to remain in the first region and a third region of the P well. The first region may be a region in which a P+ layer is formed, which is described below, and the third region may be a region in which a trench is formed, which is described below. The first region and the third region may adjoin and contact the second region and may be different regions in the P well.

After forming the n+ layer, the deposition unit 120 may deposit a first SiN layer on the entire P well. That is, the deposition unit 120 may serve to deposit the first SiN layer by covering an upper end of the P well, in which the n+ layer is formed in the second region and the oxide layer is formed in the first and third regions, with the SiN layer.

In addition, the deposition unit 120 may prevent the oxide layer from being covered with the first SiN layer by planarizing the deposited first SiN layer based on the upper end of the oxide layer remaining in the first region in a process of forming the n+ layer. That is, the deposition unit 120 may cause the deposited first SiN layer to remain only in the second region based on the upper end of the oxide layer for planarizing the covering first SiN layer.

Thereafter, the forming unit 110 may form a p+ layer by injecting p+ ions into the first region of the P well on which the first SiN layer is deposited.

To form the p+ layer, the forming unit 110 may apply photoresist to the entire P well on which the first SiN layer is deposited. That is, the forming unit 110 may apply photoresist to the entire upper end of the P well in which the n+ layer and the SiN layer are formed in the second region and the oxide layer is formed in the first and third regions.

Thereafter, the forming unit 110 may form a pattern for the first region by exposure and a developer. That is, the forming unit 110 may remove photoresist applied to the first region and may pattern to expose the oxide layer. In this case, the forming unit 110 may maintain the oxide layer without removing photoresist applied to the third region.

In addition, the forming unit 110 may remove the oxide layer of the first region by using a wet or dry etching process based on the pattern. That is, the forming unit 110 may etch the oxide layer in the first region and a portion of the P well under the oxide layer based on a designed pattern.

After the oxide layer of the first region is removed, the forming unit 110 may etch the SiN layer of the second region in a trimming process. That is, the forming unit 110 may cause the first region to overlap with the second region.

In this case, the trimming process may be an isotropic etching process using physical and chemical reactions using a chemical reaction using a solution or plasma.

In addition, the forming unit 110 may form the p+ layer by injecting the p+ ions into the first region from which the oxide layer is removed. That is, the forming unit 110 may determine a p+ active region by injecting ions to form the p+ layer into the first region that is a different portion of the P well.

Thereafter, the forming unit 110 may remove photoresist remaining in the second and third regions.

Through this, the self-aligning processing device 100 may provide the P well in which the n+ layer and the first SiN layer are formed as the second region, the p+ layer is formed as the first region, and the oxide layer is formed as the third region.

After forming the p+ layer, the deposition unit 120 may deposit a second SiN layer on the entire P well. That is, the deposition unit 120 may deposit the second SiN layer by covering an upper end of the P well, in which the n+ layer and the first SiN layer are formed as the second region, the p+ layer is formed as the first region, and the oxide layer is formed as the third region, with the second SiN layer.

In addition, for the second region, the deposition unit 120 may cause the second SiN layer to remain on the p+ layer by planarizing the deposited second SiN layer based on the upper end of the first SiN layer formed in the second region. That is, the deposition unit 120 may cause the deposited second SiN layer to remain only in the first region based on the upper end of the first SiN layer for planarizing the covering second SiN layer.

Accordingly, the p+ layer and the second SiN layer may be formed in the first region, the n+ layer and the first SiN layer are formed in the second region, and the oxide layer is formed in the third region.

In addition, the forming unit 110 may form a trench on the P well on which the second SiN layer is deposited.

To form the trench, the forming unit 110 may apply photoresist to the entire P well. That is, the forming unit 110 may apply photoresist to the entire upper end of the P well in which the p+ layer and the second SiN layer are formed as the first region, the n+ layer and the first SiN layer are formed as the second region, and the oxide layer is formed as the third region.

Thereafter, the forming unit 110 may form a pattern for the third region in which the trench is formed by exposure and a developer. That is, the forming unit 110 may remove photoresist applied to the third region that is designed to include a trench and may pattern to expose the oxide layer under the third region.

In addition, the forming unit 110 may form the trench by removing the oxide layer of the third region by using a wet or dry etching process based on the pattern. That is, the forming unit 110 may etch the oxide layer on the third region based on the designed pattern.

In this case, wet etching may be a method of etching an oxide layer through a chemical reaction using an HF solution. In addition, dry etching may be a method of etching an oxide layer through chemical and physical reactions using plasma.

In addition, after the oxide layer of the third region is removed, the forming unit 110 may form the trench by removing a portion of the SiN layer of the second region by using a trimming etching process. That is, the forming unit 110 may form the trench by removing the third region and the portion of the second region.

In this case, the trimming process may be an isotropic etching process using physical and chemical reactions using a chemical reaction using a solution or plasma.

Thereafter, the forming unit 110 may remove photoresist remaining in the first region and the second region.

Through this, the self-aligning processing device 100 may provide a P well having a trench as the third region.

In addition, the forming unit 110 may form a BPW and a gate in the trench. That is, the forming unit 110 may complete a SiC trench gate MOSFET by providing the BPW and the gate through the formed trench.

According to an example embodiment, a self-aligning processing method and a self-aligning processing device for reducing critical dimension variation of a SiC trench gate MOSFET structure which may significantly reduce line-width variation ($\Delta$CD) using two dielectrics of $SiO_2$ and silicon nitride (e.g., a SiN layer) may be provided.

In addition, according to an example embodiment, a self-aligning processing model using two dielectric materials having different selectivities to reduce the line-width variation ($\Delta$CD) may be provided.

In a photo process, line-width variation ($\Delta$CD) may be great based on a characteristic of photoresist, a process condition, and an environment.

A conventional trench gate MOSFET structure processing method may cause the line-width variation ($\Delta$CD). The line-width variation ($\Delta$CD) may cause production of a device that is different from an initial purpose of device design, and this may trigger a semiconductor reliability problem.

To solve the problem described above, the present disclosure proposes a self-aligning processing method using a dielectric material having two different selectivities to reduce the line-width variation ($\Delta$CD).

The present disclosure may include a self-aligning processing method using two dielectric materials (e.g., silicon dioxide and silicon nitride) with different selectivities.

FIGS. 2A to 2F are diagrams illustrating a process order to form a prior trench gate MOSFET structure.

FIGS. 2A to 2F illustrate examples of forming an n+ region and a trench based on a conventional self-aligning process.

The conventional self-aligning process may not remove a dielectric material used to form a p+ region and may generate a different region other than the p+ region using a different dielectric material thereon without an error.

The conventional self-aligning process may have great advantages of having the same number of masks used in the conventional trench gate MOSFET structure process and reducing line-width variation ($\Delta$CD).

Process 1 of the conventional trench gate MOSFET structure may be a process of forming an align key using a first mask.

Process 2 may be a process of forming (an active region) a P well using a second mask.

In process 2, oxide and photoresist may be deposited on a substrate on which $SiO_2$ is layered. In addition, in process 2, a pattern may be formed by exposure and a developer. In addition, in process 2, an ion injection process by P ions may be performed. In addition, in process 2, photoresist may be removed by ashing. In addition, in process 2, a cleaning process may be performed.

Figure 2A:
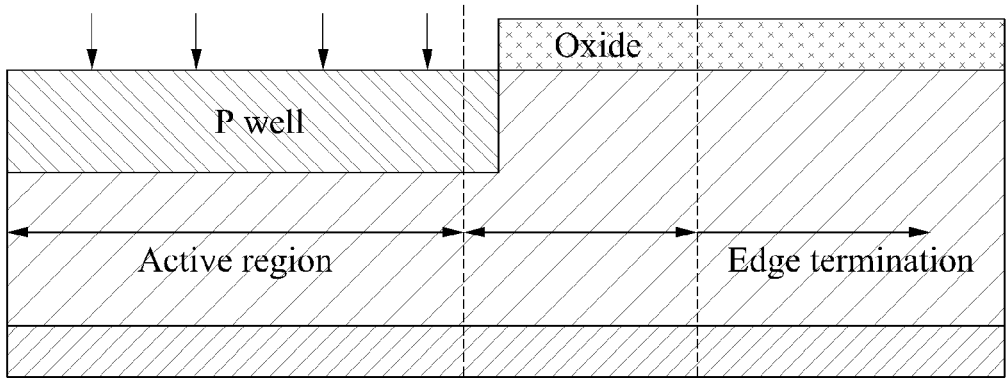
FIGS. 2A to 2F are diagrams illustrating a process order to form a prior trench gate MOSFET structure.

Through this, as illustrated in FIG. 2A, process 2 may implement an edge termination structure in which a portion of $SiO_2$ is formed as a P well that is an active region and oxide is deposited on the other portion of $SiO_2$.

Process 3 may be a process of forming (an active region) n+ using a third mask.

In process 3, oxide and photoresist may be deposited on a substrate in which the P well is formed. In addition, in process 3, a pattern may be formed by exposure and a developer. In addition, in process 3, an ion injection process by n ions may be performed. In addition, in process 3, photoresist may be removed by ashing. In addition, in process 3, a cleaning process may be performed.

Figure 2B:
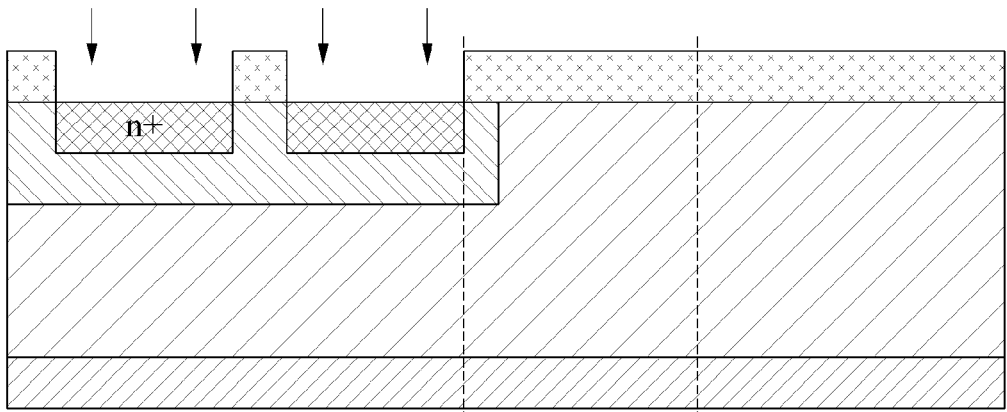

Through this, in process 3, as illustrated in FIG. 2B, a structure in which n+ is formed as a portion of the P well may be implemented.

Process 4 may be a process of forming (an active region and a termination region) p+ using a fourth mask.

In process 4, oxide and photoresist may be deposited on a substrate in which n+ is formed as a portion of the P well. In addition, in process 4, a pattern may be formed by exposure and a developer. In addition, in process 4, an ion injection process by p ions may be performed. In addition, in process 4, photoresist may be removed by ashing. In addition, in process 4, a cleaning process may be performed.

Figure 2C:
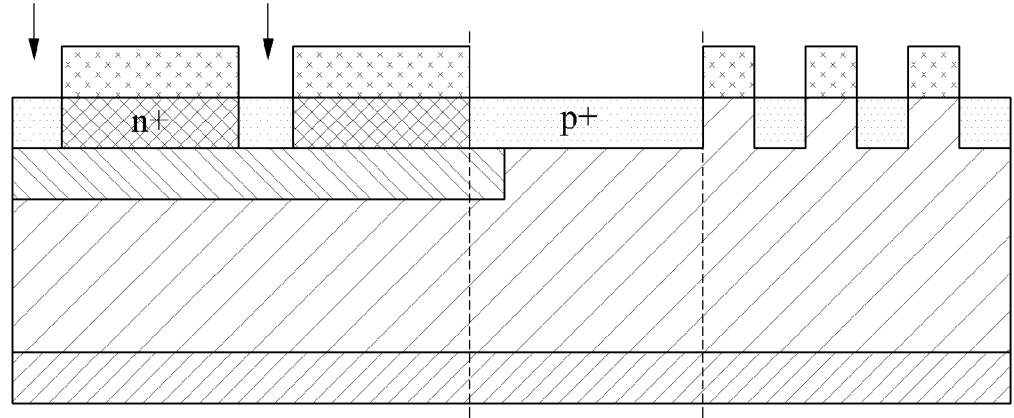

Through this, in process 4, as illustrated in FIG. 2C, a structure in which P+ is formed as another portion of the P well may be implemented.

Process 5 may be a process of forming (an active region) a trench using a fifth mask.

In process 5, oxide may be deposited on a substrate in which P+ is formed as the other portion of the P well. In addition, in process 5, photoresist may be deposited. In addition, in process 5, a pattern may be formed by exposure and a developer. In addition, in process 5, oxide dry etching may be performed. In addition, in process 5, a trench may be formed by etching by SiC dry. In addition, in process 5, an oxide mask may be removed.

Figure 2D:
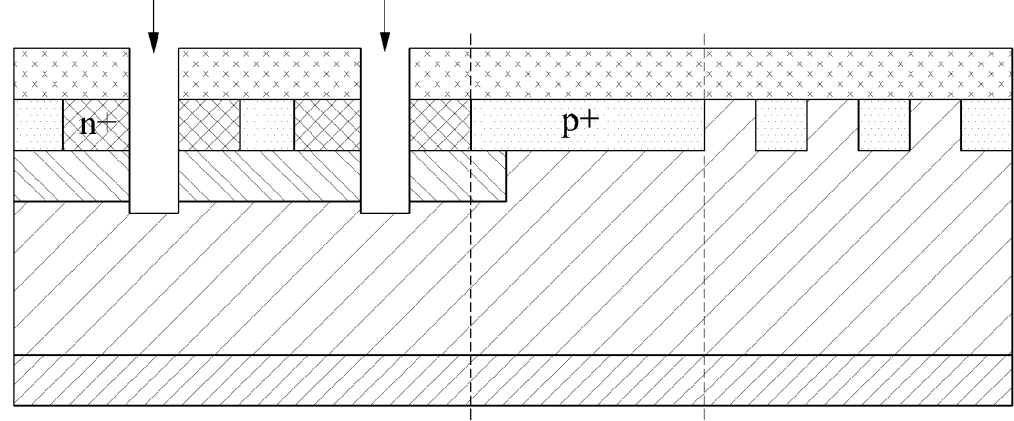

Through this, in process 5, as illustrated in FIG. 2D, a structure in which a trench is formed may be implemented.

Process 6 may be a process of forming (an active region) a BPW.

In process 6, sacrificial oxide may be deposited on a substrate in which a trench is formed. In process 6, to form the BPW, a p ion injection process may be performed.

Figure 2E:
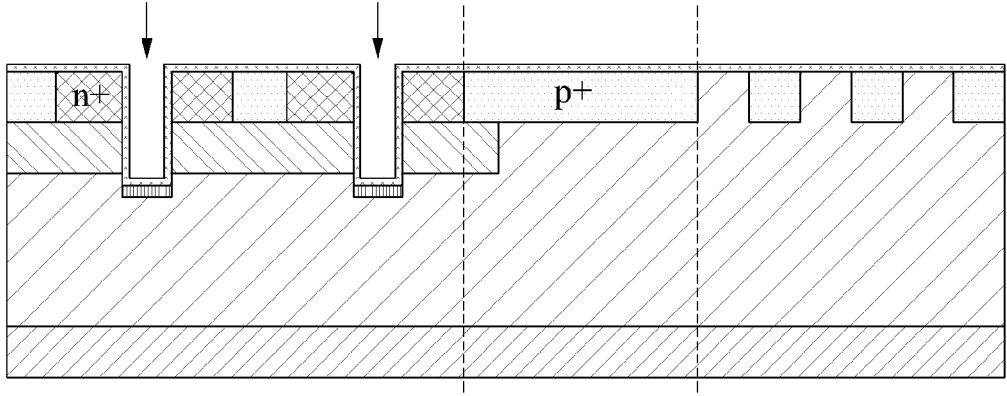

Through this, in process 6, as illustrated in FIG. 2E, a structure in which the BPW is formed may be implemented.

Process 7 may be a process of forming (an active region) a gate.

In process 7, sacrificial oxide that is deposited in process 6 described above may be removed. In addition, in process 7, gate oxide may be formed by thermal oxidation, plasma-enhanced chemical vapor deposition (PECVD), or low pressure chemical vapor deposition (LPCVD) processes. In addition, in process 7, a gate may be formed by depositing polysilicon.

Figure 2F:
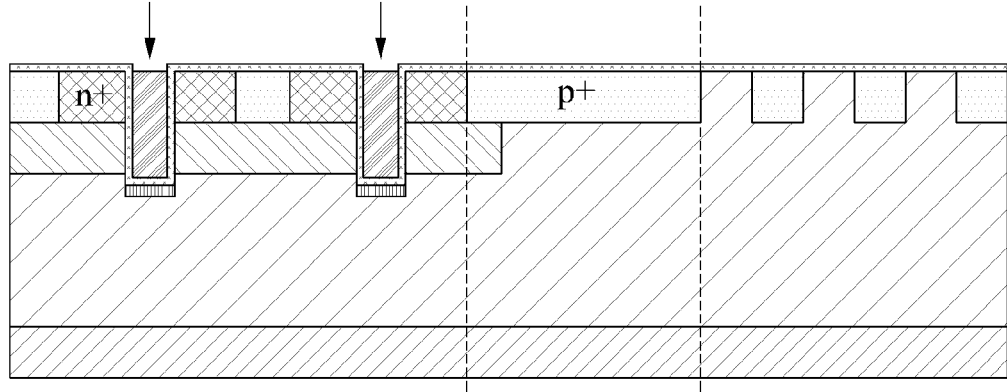

Through this, in process 7, as illustrated in FIG. 2F, a structure in which a gate is formed may be implemented.

Figure 3:
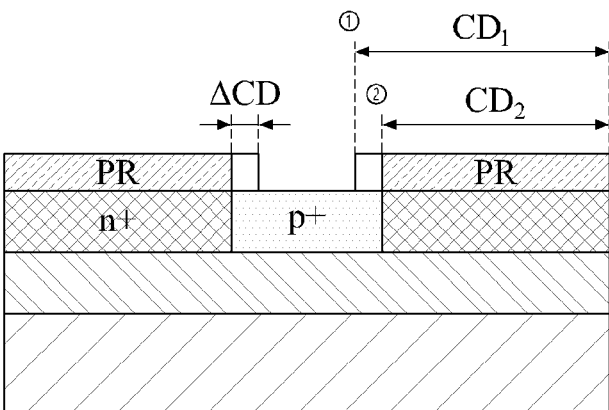
FIG. 3 is a diagram illustrating an example of a critical dimension occurring in a process of forming a p+ area of FIG. 2C.

FIG. 3 is a diagram illustrating an example of a critical dimension occurring in a process of forming a p+ area of FIG. 2C.

FIG. 3 shows critical dimension variation ($\Delta$CD).

As illustrated in FIG. 3, an error of varying critical dimension may occur because in a p+ region, doping has occurred outside a region ②, not a region ①, which is a purpose of the design.

To prevent such critical dimension variation, the present disclosure proposes an improved process order shown below.

FIGS. 4A to 4H are diagrams illustrating a process order of a self-aligning trench gate MOSFET structure according to a first example embodiment.

In the first example embodiment, in the same manner as processes 1 and 2 of the conventional trench gate MOSFET structure process, the self-aligning processing device 100 may form an align key using a first mask and may form (an active region) a P well using a second mask.

Process 3 of a first example embodiment may be a process of forming (an active region and a termination region) a p+ region using a third mask.

In process 3 of the first example embodiment, oxide (or SiN) and photoresist may be deposited on the substrate. In addition, in process 3 of the first example embodiment, a pattern may be formed by exposure and a developer. In addition, in process 3 of the first example embodiment, etching by oxide dry may be performed. In addition, in process 3 of the first example embodiment, P+ ions may be injected. In addition, in process 3 of the first example embodiment, photoresist may be removed by an ashing process.

Figure 4A:
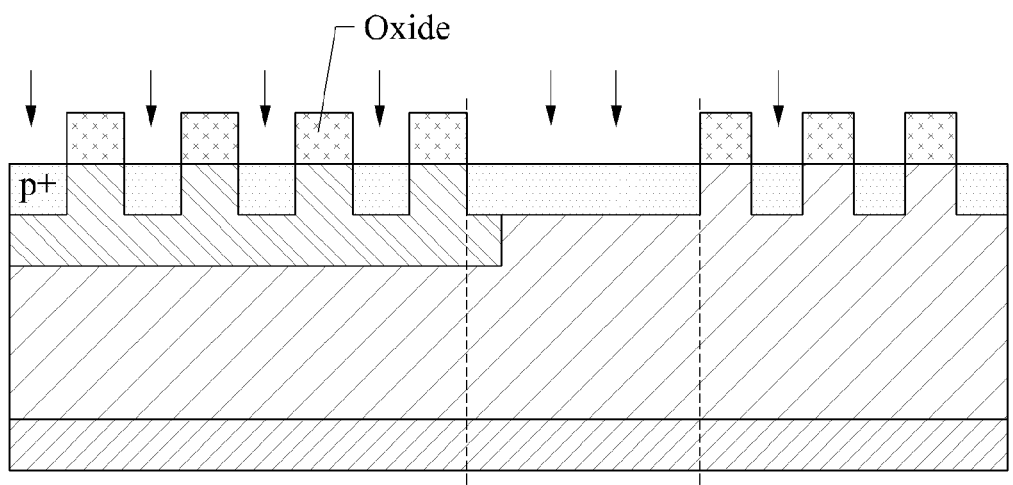
FIGS. 4A to 4H are diagrams illustrating a process order of a self-aligning trench gate MOSFET structure according to a first example embodiment.

Through this, process 3 of the first example embodiment may implement the structure of FIG. 4A in which p+ is formed as the first region of a P well and oxide is formed as the second region.

Process 4 of the first example embodiment may be a process of depositing and planarizing a SiN dielectric.

In process 4 of the first example embodiment, a SiN dielectric may be deposited on the substrate. In addition, in process 4 of the first example embodiment, SiN may be planarized using a CMP process or planarization etching.

Figure 4B:
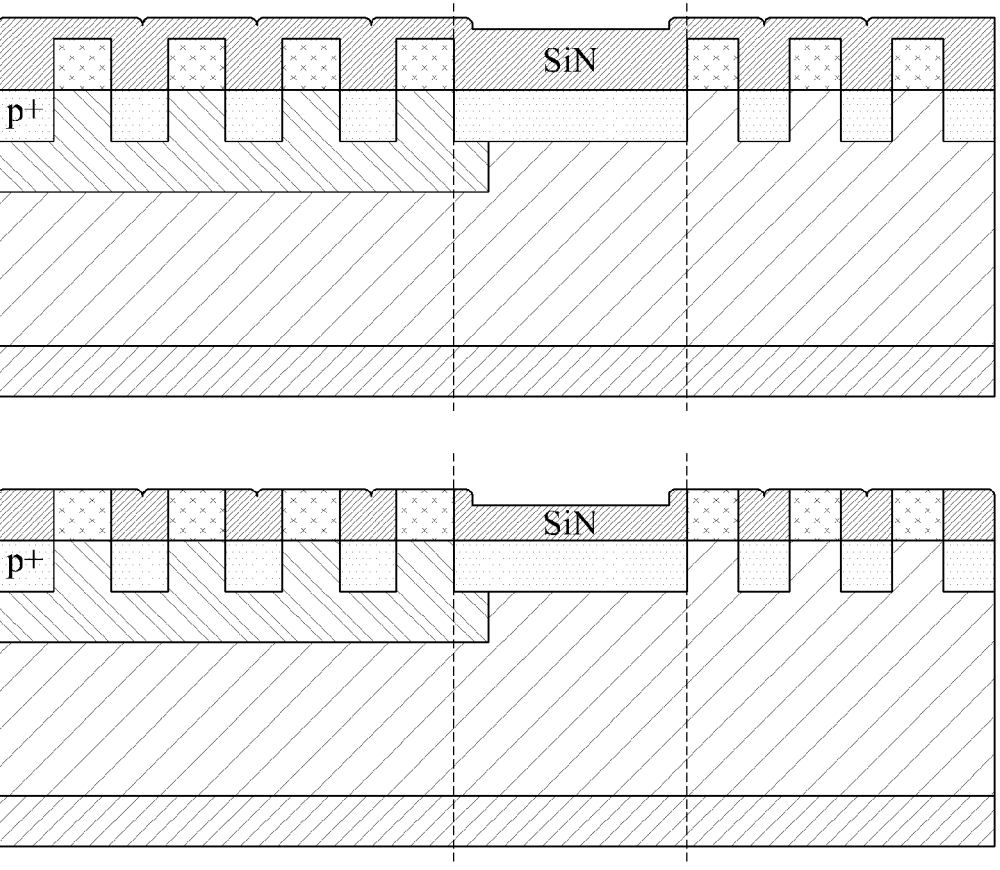

Through this, process 4 of the first example embodiment may implement the structure of FIG. 4B in which the planarized SiN and P+ are formed as the first region and oxide is formed as the second region.

Process 5 of the first example embodiment may be a process of forming (an active region) an n+ region using a fourth mask.

Three methods of processing the N+ region may be proposed herein.

As a first method, in process 5 of the first example embodiment, photoresist may be deposited on the substrate. In addition, in process 5 of the first example embodiment, a pattern may be formed by exposure and a developer for a region in which an n source is formed. In process 5 of the first example embodiment, oxide may be removed through a wet or dry etching process. The etching rate of oxide may be different from the etching rate of SiN depending on a chemical solution used in the wet process and etching gas used in the dry process. In addition, in process 5 of the first example embodiment, n+ ions may be injected. In addition, in process 5 of the first example embodiment, photoresist may be removed by an ashing process.

Figure 4C:
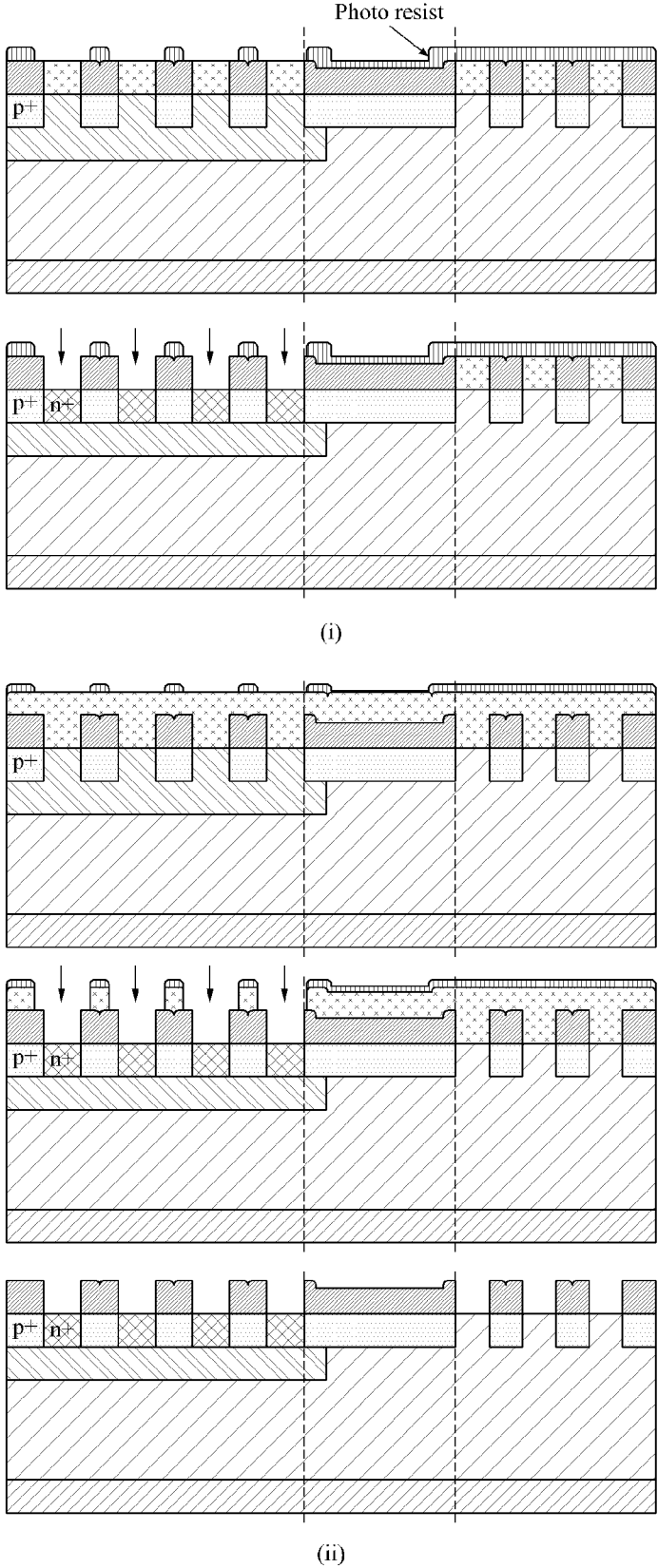

Through this, process 5 of the first example embodiment may implement the structure of FIG. 4C in which SiN and P+ are formed as the first region and n+ is formed as the second region.

As a second method, in process 5 of the first example embodiment, photoresist may be deposited on the substrate. In addition, in process 5 of the first example embodiment, a pattern may be formed by exposure and a developer for a region in which an n source is formed. In process 5 of the first example embodiment, oxide may be removed by a wet or dry etching process and a portion of the SiN layer in the first region may be removed by a trimming etching process. In addition, in process 5 of the first example embodiment, n+ ions may be injected. In addition, in process 5 of the first example embodiment, photoresist may be removed by an ashing process.

Through this, process 5 of the first example embodiment may implement the structure of FIG. 4C in which SiN, p+, and a portion of n+ are formed as the first region and n+ is formed as the second region.

As a third method, in process 5 of the first example embodiment, oxide and photoresist may be sequentially deposited on the substrate. In addition, in process 5 of the first example embodiment, a pattern may be formed by exposure and a developer for a region in which an n source is formed. In addition, in process 5 of the first example embodiment, oxide may be removed through a wet or dry etching process. In addition, in process 5 of the first example embodiment, n+ ions may be injected. In addition, in process 5 of the first example embodiment, photoresist and all masks may be removed.

Through this, process 5 of the first example embodiment may implement the structure of FIG. 4C in which SiN and P+ are formed as the first region and n+ is formed as the second region.

Process 6 of the first example embodiment may be a process of depositing and planarizing oxide.

In process 6 of the first example embodiment, oxide may be deposited on the substrate. In addition, in process 6 of the first example embodiment, oxide may be planarized using a CMP process or planarization etching.

Figure 4D:
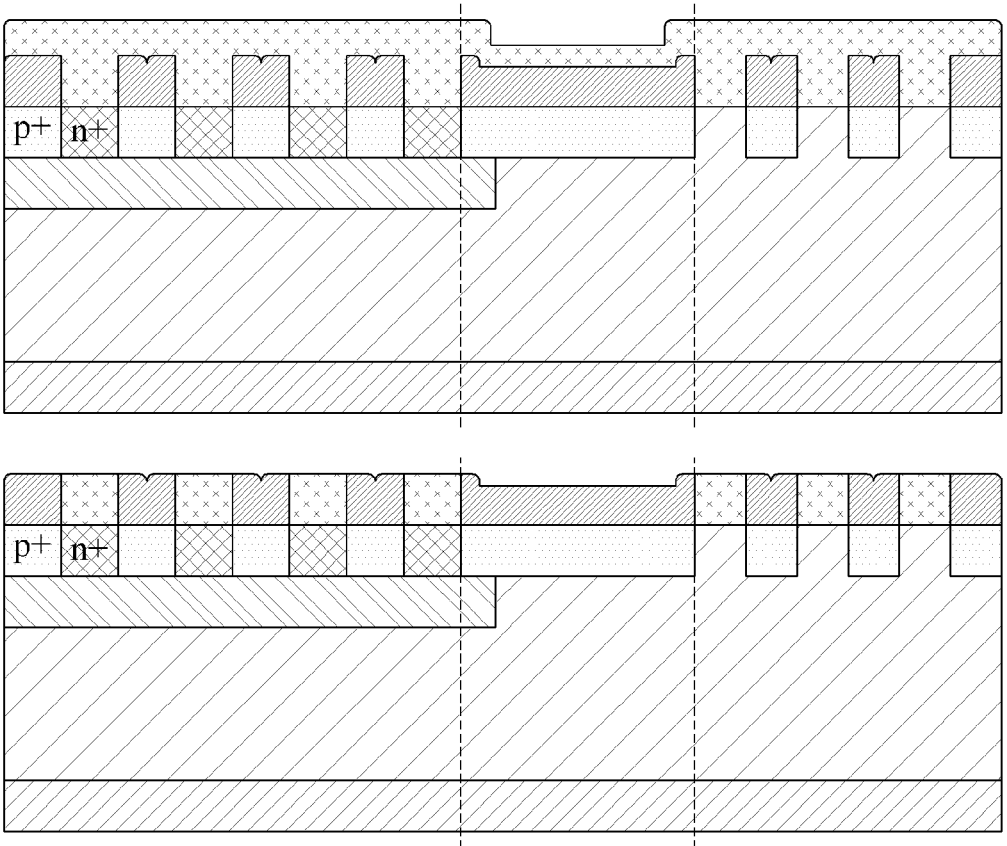

Through this, process 6 of the first example embodiment may implement the structure of FIG. 4D in which the planarized SiN and P+ are formed as the first region and oxide and n+ are formed as the second region.

Process 7 of the first example embodiment may be a process of forming (an active region) a trench using a fifth mask.

Three methods of forming a trench may be proposed herein.

As a first method, in process 7 of the first example embodiment, photoresist may be deposited on the substrate. In addition, in process 7 of the first example embodiment, a pattern may be formed by exposure and a developer for a region in which a trench is formed. Here, a region in which a trench is formed may be a portion of the first region in which planarized SiN and P+ are formed and may be referred to as a third region herein. In addition, in process 7 of the first example embodiment, SiN may be removed through a wet or dry etching process.

Figure 4E:
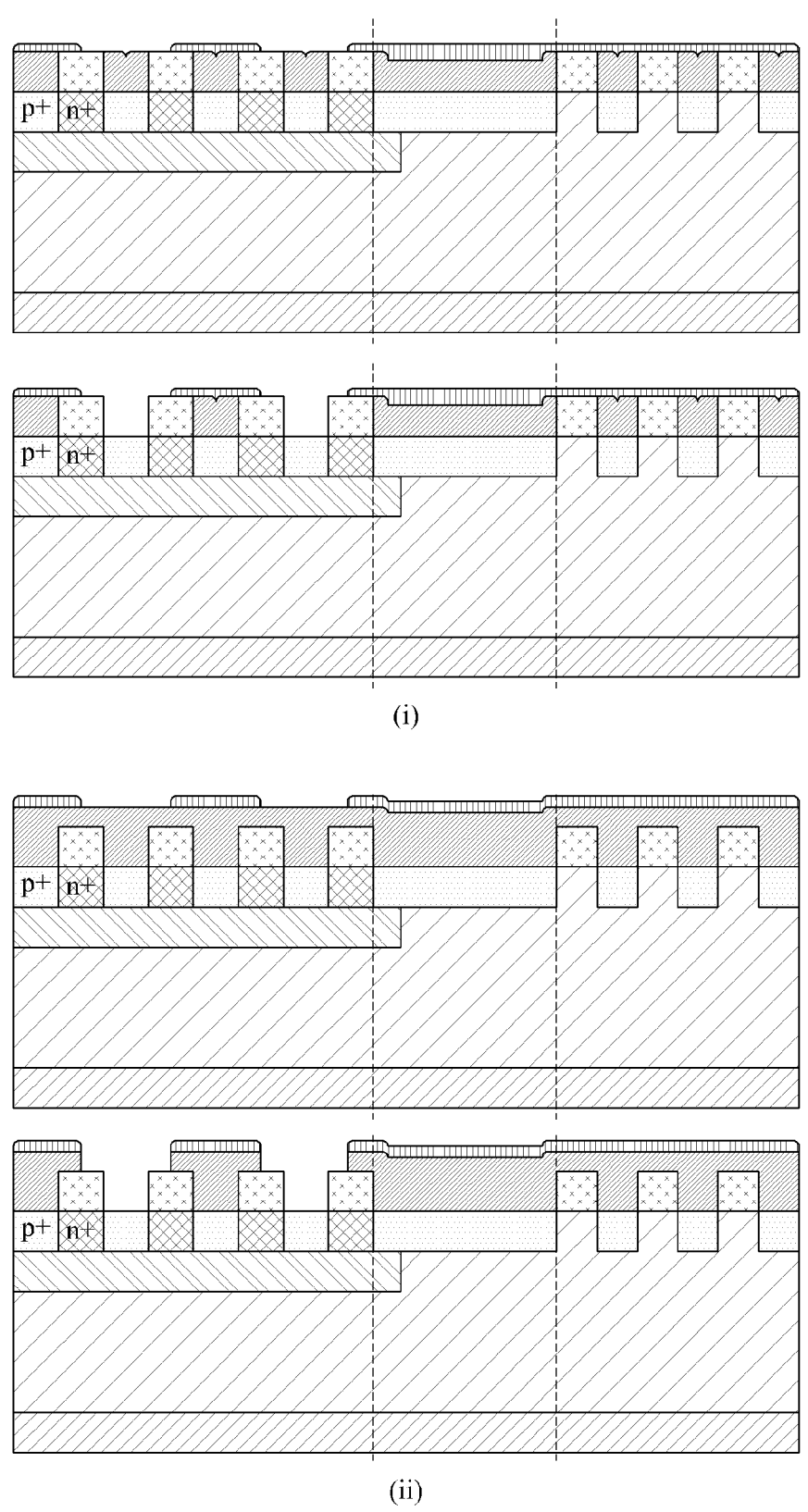

Through this, process 7 of the first example embodiment may implement the structure of FIG. 4E in which P+ of the first region is exposed by a trench that is formed as SiN is removed from the third region.

As a second method, in process 7 of the first example embodiment, photoresist may be deposited on the substrate. In addition, in process 7 of the first example embodiment, a pattern may be formed by exposure and a developer for a region in which a trench is formed. Here, a region in which a trench is formed may be a portion of the first region in which planarized SiN and P+ are formed and may be a portion of the second region in which oxide and N+ exposed to the patterning process are formed. In addition, in process 7 of the first example embodiment, SiN may be removed using a wet or dry etching process and oxide may be partially removed through a trimming process.

Through this, process 7 of the first example embodiment may implement the structure of FIG. 4E in which P+ is exposed by the trench that is formed as a portion of oxide in the second region and SiN in the third region are removed.

As a third method, in process 7 of the first example embodiment, SiN and photoresist may be deposited on the substrate. In addition, in process 7 of the first example embodiment, a pattern may be formed by exposure and a developer for a region in which a trench is formed. In addition, in process 7 of the first example embodiment, SiN may be removed using a wet or dry etching process.

Through this, process 7 of the first example embodiment may implement the structure of FIG. 4E in which P+ is exposed by a trench that is formed as SiN is removed from the third region. Here, as illustrated in FIG. 4E, the first region and the second region may be stacked by the deposited SiN.

Process 8 of the first example embodiment may be a process of completing formation of the trench.

In process 8 of the first example embodiment, a trench may be formed by dry etching. In addition, in process 8 of the first example embodiment, photoresist and all masks may be removed. In addition, in process 8 of the first example embodiment, a cleaning process may be performed. In addition, in process 8 of the first example embodiment, sacrificial oxide may be formed as a protective layer to form a bottom protection well.

Figure 4F:
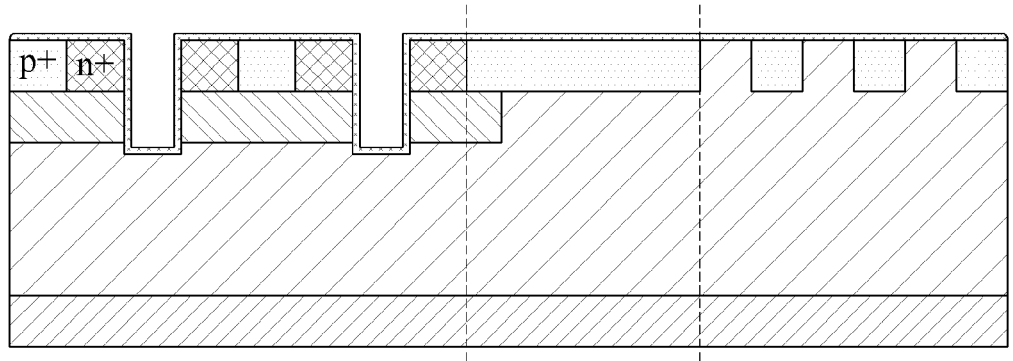

Through this, process 8 of the first example embodiment may implement a structure in which a trench is formed as illustrated in FIG. 4F.

Process 9 of the first example embodiment may be a process of forming (an active region) a bottom protection well.

In process 9 of the first example embodiment, a BPW may be formed by a P ion injection process. In addition, in process 9 of the first example embodiment, sacrificial oxide may be removed. In addition, in process 9 of the first example embodiment, gate oxide may be formed by thermal oxidation, PECVD, LPCVD, and the like.

Figure 4G:
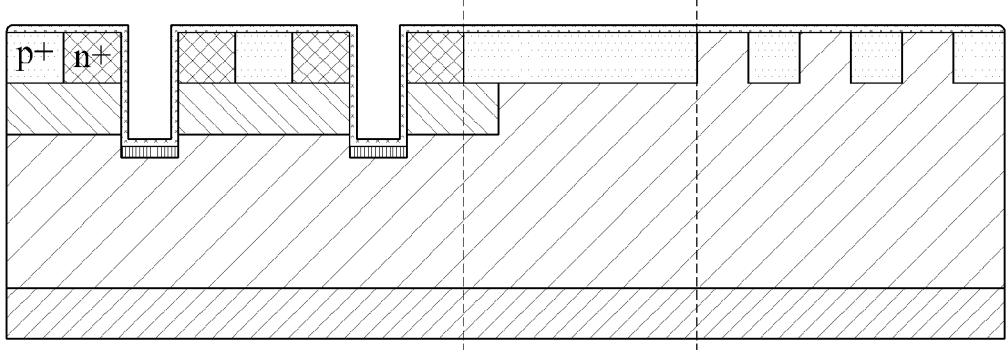

Through this, process 9 of the first example embodiment may implement a structure in which a bottom protection well is formed as illustrated in FIG. 4G.

Process 10 of the first example embodiment may be a process of forming (an active region) a gate.

In process 10 of the first example embodiment, a gate may be formed during a deposition process of polysilicon.

Figure 4H:
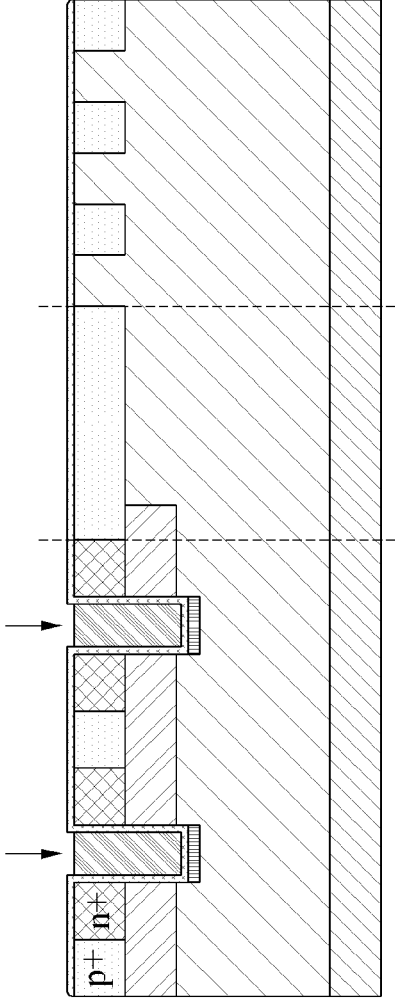

Through this, process 10 of the first example embodiment may implement a structure in which a gate is formed as illustrated in FIG. 4H.

FIGS. 5A to 5H are diagrams illustrating a process order of a self-aligning trench gate MOSFET structure according to a second example embodiment.

In the second example embodiment, in the same manner as processes 1 and 2 of the conventional trench gate MOSFET structure process, the self-aligning processing device 100 may form an align key using a first mask and may form (an active region) a P well using a second mask.

Process 3 of the second example embodiment may be a process of forming (an active region and a termination region) of an n+ region using a third mask.

In process 3 of the second example embodiment, oxide (or SiN) and photoresist may be deposited on the substrate. In addition, in process 3 of the second example embodiment, a pattern may be formed by exposure and a developer. In addition, in process 3 of the second example embodiment, etching by oxide dry may be performed. In addition, in process 3 of the second example embodiment, n+ ions may be injected. In addition, in process 3 of the second example embodiment, photoresist may be removed by an ashing process.

Figure 5A:
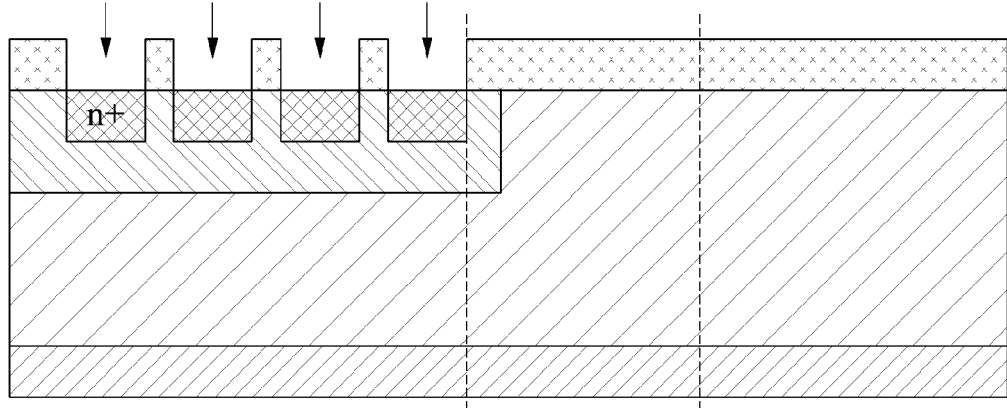
FIGS. 5A to 5H are diagrams illustrating a process order of a self-aligning trench gate MOSFET structure according to a second example embodiment.

Through this, process 3 of the second example embodiment may implement the structure of FIG. 5A in which n+ is formed as the second region of the P well and oxide is formed as the first region.

Process 4 of the second example embodiment may be a process of depositing and planarizing a SiN dielectric.

In process 4 of the second example embodiment, a SiN dielectric may be deposited on the substrate. In addition, in process 4 of the second example embodiment, SiN may be planarized using a CMP process or planarization etching.

Figure 5B:
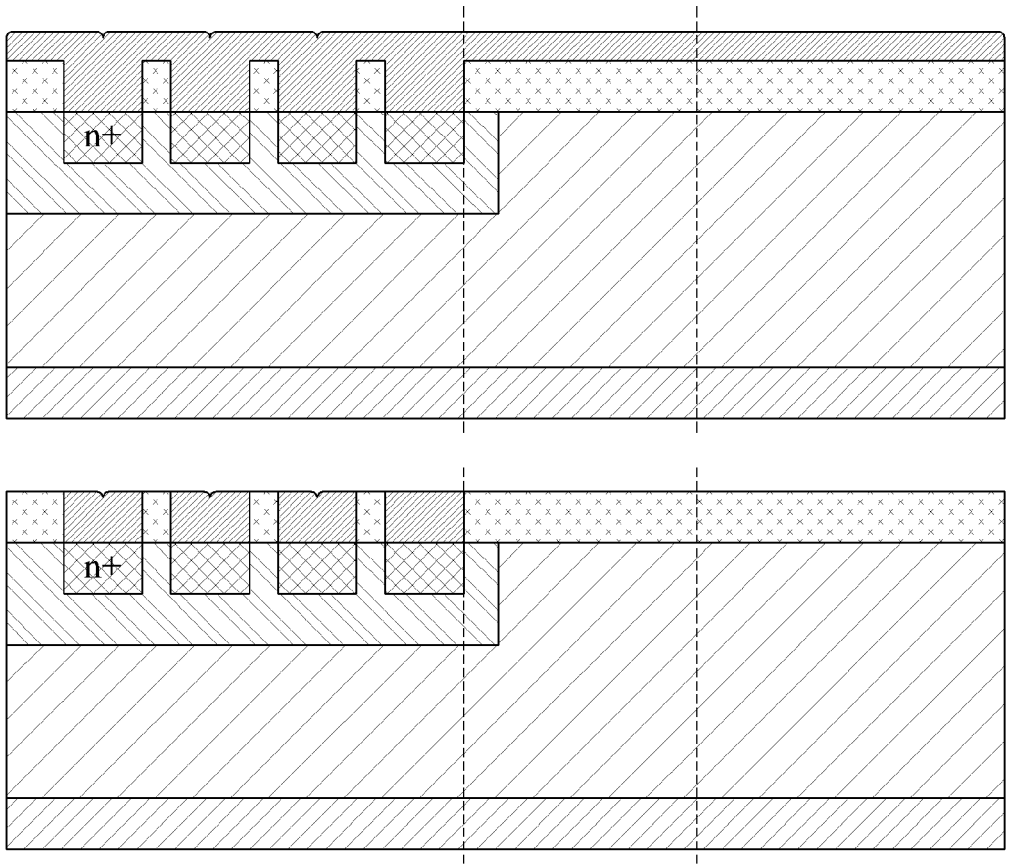

Through this, process 4 of the second example embodiment may implement the structure of FIG. 5B in which the planarized SiN and n+ are formed as the second region and oxide is formed as the first region.

Process 5 of the second example embodiment may be a process of forming (an active region) a p+ region using a fourth mask.

Two methods of processing the P+ region may be proposed herein.

As a first method, in process 5 of the second example embodiment, photoresist may be deposited on the substrate. In addition, in process 5 of the second example embodiment, a pattern may be formed by exposure and a developer for a region in which a p source is formed. In process 5 of the second example embodiment, oxide may be remove using a wet or dry etching process. In addition, in process 5 of the second example embodiment, p+ ions may be injected. In addition, in process 5 of the second example embodiment, photoresist may be removed by an ashing process.

Figure 5C:
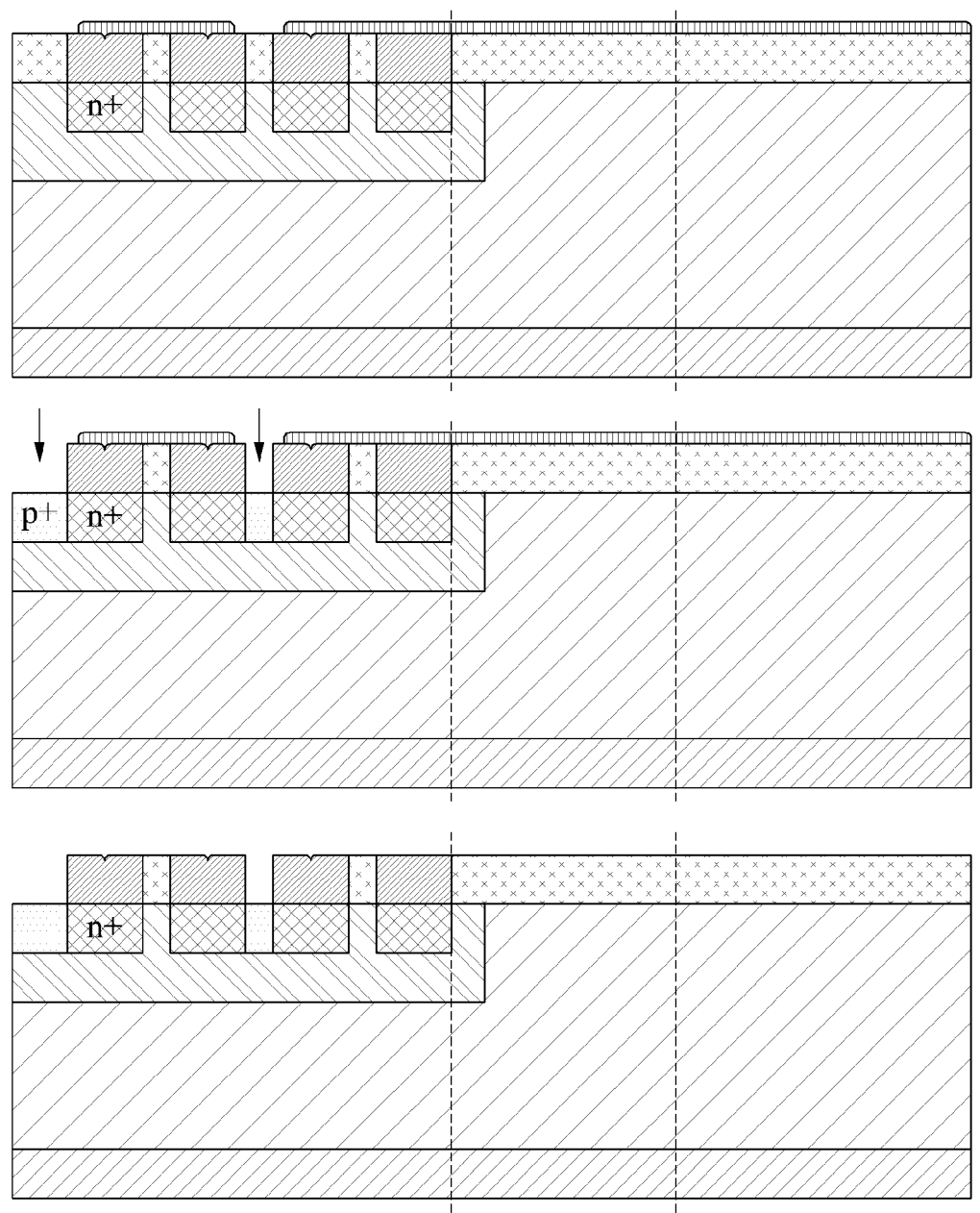

Through this, process 5 of the second example embodiment may implement the structure of FIG. 5C in which SiN and n+ are formed as the second region, p+ is formed as the first region, and oxide is formed as the third region.

As a second method, in process 5 of the second example embodiment, photoresist may be deposited on the substrate. In addition, in process 5 of the second example embodiment, a pattern may be formed by exposure and a developer for a region in which a p source is formed. In process 5 of the second example embodiment, oxide may be removed by a wet or dry etching process and a portion of the SiN layer in the second region may be removed by a trimming etching process. In addition, in process 5 of the second example embodiment, p+ ions may be injected. In addition, in process 5 of the second example embodiment, photoresist may be removed by an ashing process.

Through this, process 5 of the second example embodiment may implement the structure of FIG. 5C in which SiN, p+, and a portion of n+ are formed as the second region and n+ is formed as the second region.

Process 6 of the second example embodiment may be a process of depositing and planarizing SiN.

In process 6 of the second example embodiment, SiN may be deposited on the substrate. In addition, in process 6 of the second example embodiment, SiN may be planarized using a CMP process or planarization etching.

Figure 5D:
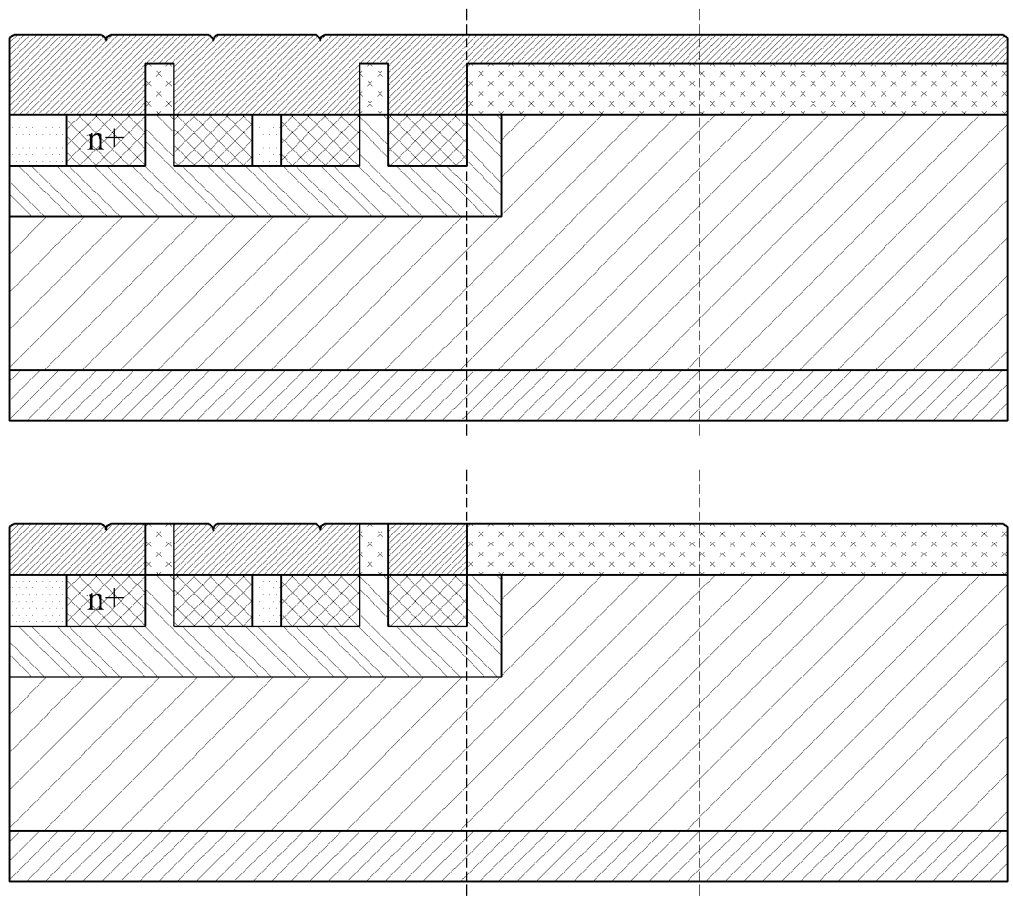
Figure 5E:
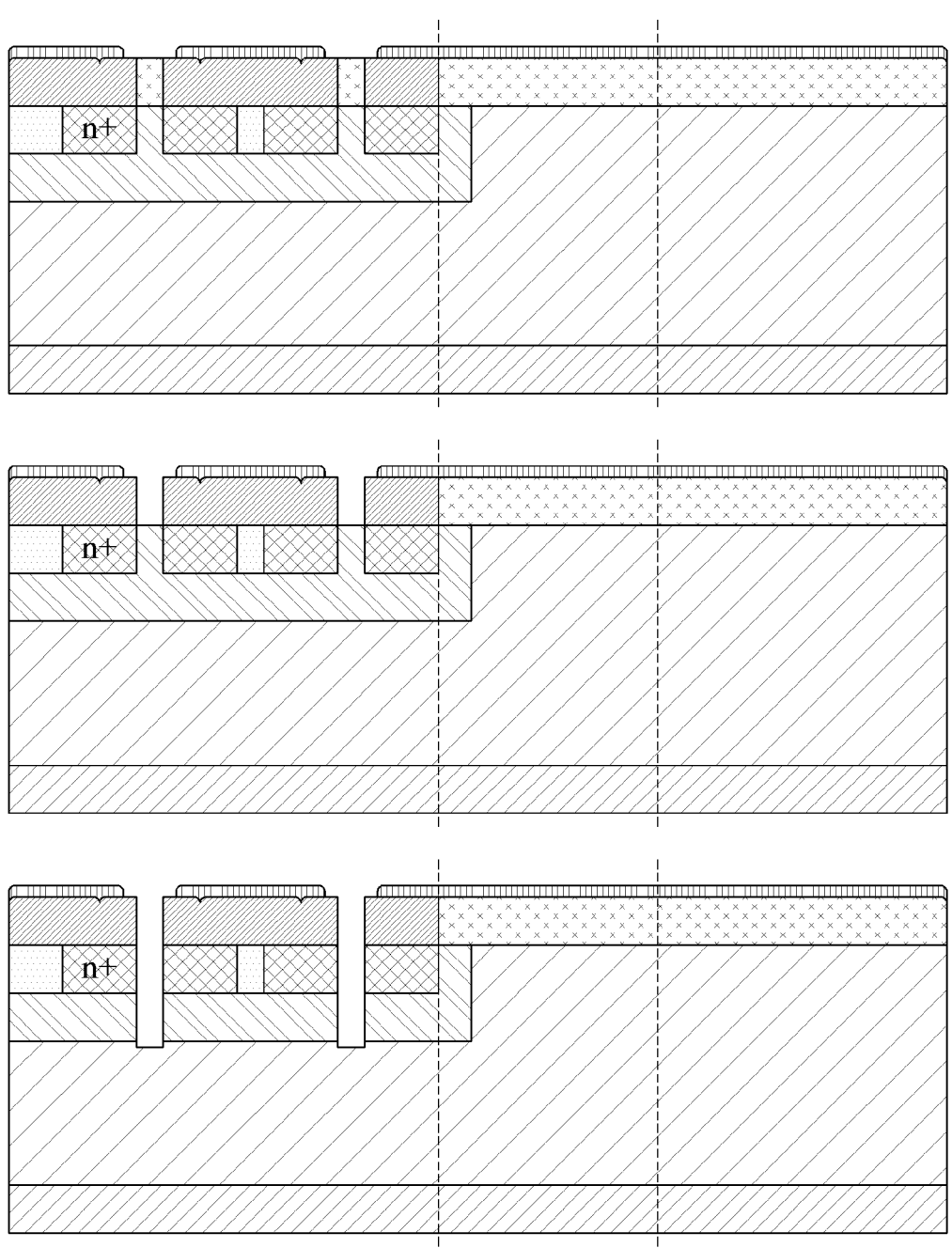

Through this, process 6 of the second example embodiment may implement the structure of FIG. 5D in which the planarized SiN and P+ are formed as the first region, the planarized SiN and n+ are formed as the second region, and oxide is formed as the third region.

Process 7 of the second example embodiment may be a process of forming (an active region) a trench using a fifth mask.

Two methods of forming a trench may be proposed herein.

As a first method, in process 7 of the second example embodiment, photoresist may be deposited on the substrate.

In addition, in process 7 of the second example embodiment, a pattern may be formed by exposure and a developer for a region (e.g., the third region) in which a trench is formed. In addition, in process 7 of the second example embodiment, oxide may be removed using a wet or dry etching process. In addition, in process 7 of the second example embodiment, a trench may be formed by SiC wafer drying etching.

Through this, process 7 of the second example embodiment may implement a structure in which a trench is formed as oxide is removed from the third region.

As a second method, in process 7 of the second example embodiment, photoresist may be deposited on the substrate. In addition, in process 7 of the second example embodiment, a pattern may be formed by exposure and a developer for a region (e.g., the third region) in which a trench is formed. In addition, in process 7 of the second example embodiment, oxide in the third region may be removed by a wet or dry etching process and the SiN layer in the second region may be partially removed by a trimming etching process. In addition, in process 7 of the second example embodiment, a trench may be formed by SiC wafer drying etching.

Through this, process 7 of the second example embodiment may implement the structure of FIG. 4E in which a trench is formed as oxide in the third region and a portion of the SiN layer in the second are removed.

Process 8 of the second example embodiment may be a process of forming (an active region) a bottom protection well.

In addition, in process 8 of the second example embodiment, photoresist and all masks may be removed. In addition, in process 8 of the second example embodiment, a deposition process of sacrificial oxide for a BPW and a p ion injection process may be performed.

Figure 5F:
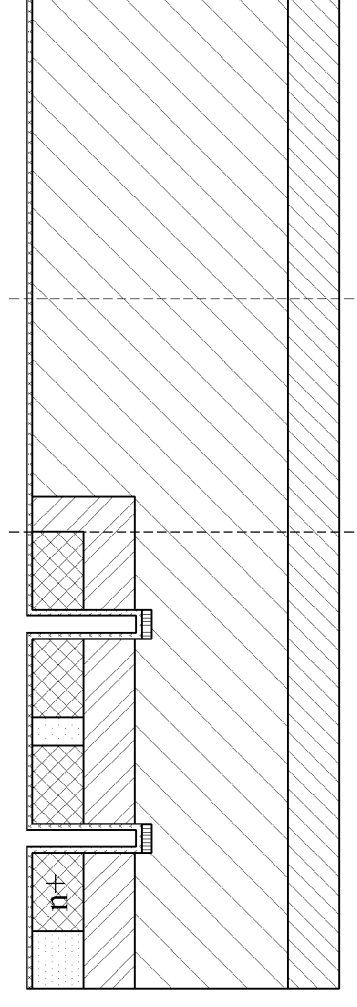

Through this, process 8 of the second example embodiment may implement a structure in which a bottom protection well is formed as illustrated in FIG. 5F.

Process 9 of the second example embodiment may be a process of forming a termination region using a sixth mask.

In process 9 of the second example embodiment, oxide and photoresist may be sequentially deposited on the substrate. In addition, in process 9 of the second example embodiment, a pattern may be formed by exposure and a developer for a region on which oxide drying etching is performed. In addition, in process 9 of the second example embodiment, oxide drying etching may be performed. In addition, in process 9 of the second example embodiment, p+ ions may be injected.

Figure 5G:
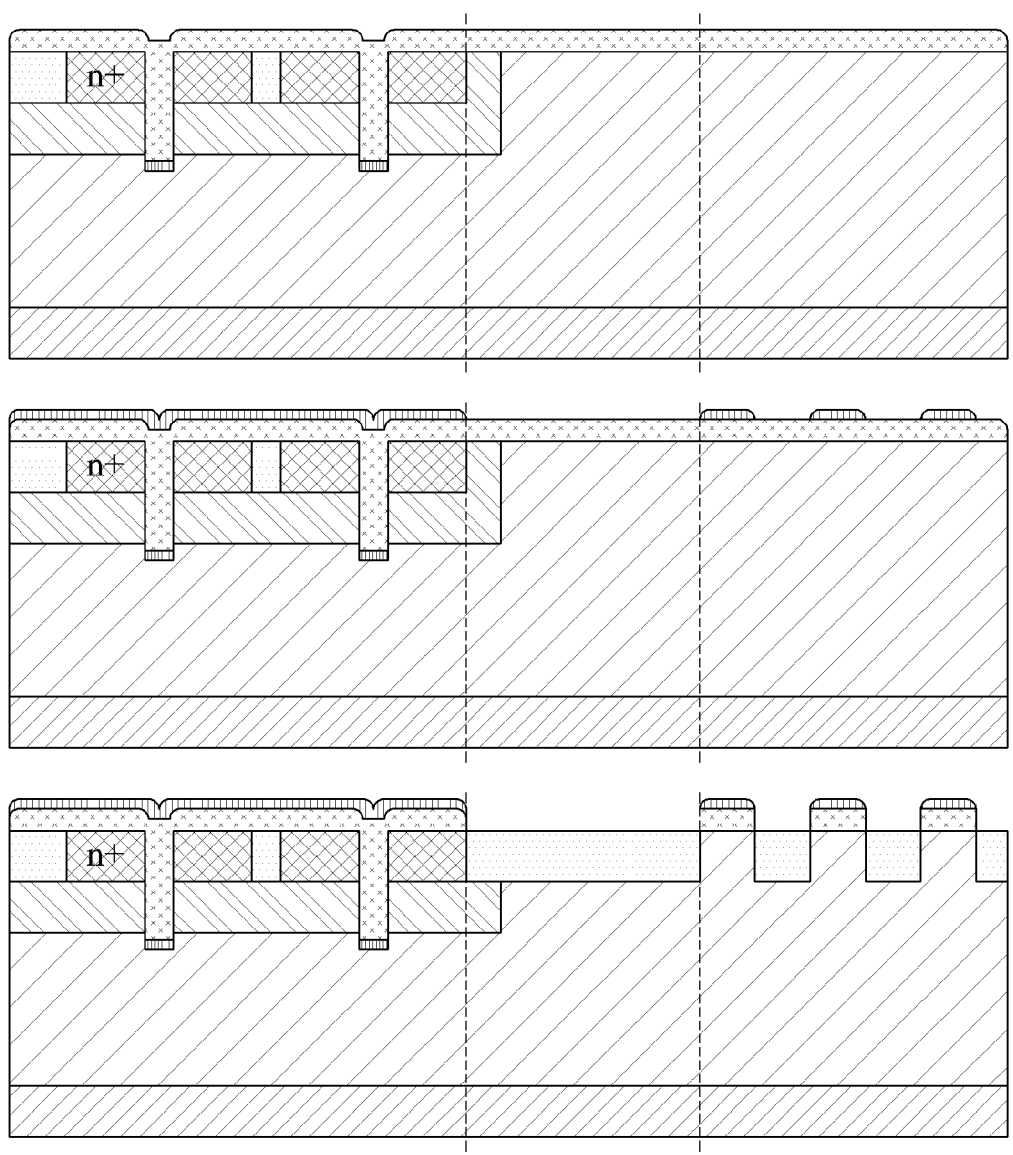

Through this, process 9 of the second example embodiment may implement a structure in which p+ is formed as a portion of edge termination as illustrated in FIG. 5G.

Process 10 of the second example embodiment may be a process of forming (an active region) a gate.

In process 10 of the second example embodiment, all masks may be removed. In addition, in process 10 of the second example embodiment, gate oxide may be formed by thermal oxidation, PECVD, or LPCVD. In addition, in process 10 of the second example embodiment, a gate may be formed during a deposition process of polysilicon.

Figure 5H:
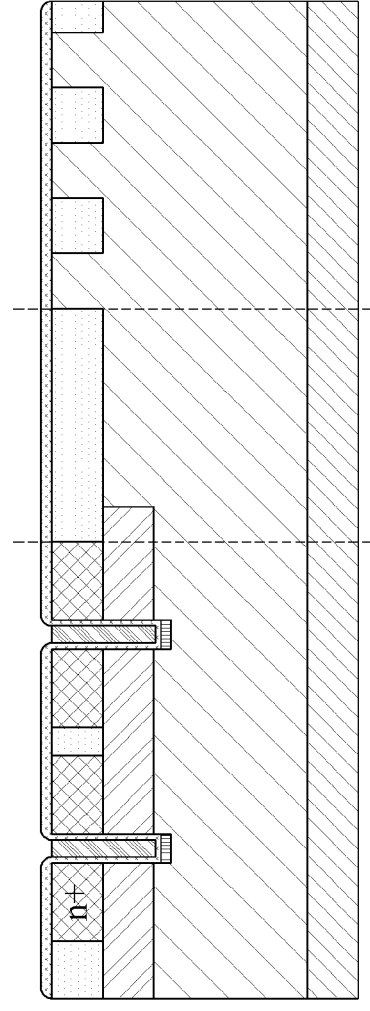

Through this, process 10 of the second example embodiment may implement a structure in which the gate is formed as illustrated in FIG. 5H.

Hereinafter, with reference to FIGS. 6 and 7, work flows of the self-aligning processing device 100 are described to reduce critical dimension variation of a SiC trench gate MOSFET structure according to example embodiments.

A self-aligning processing method may be performed by the self-aligning processing device 100 to reduce critical dimension variation of the SiC trench gate MOSFET structure according to an example embodiment.

Figure 6:
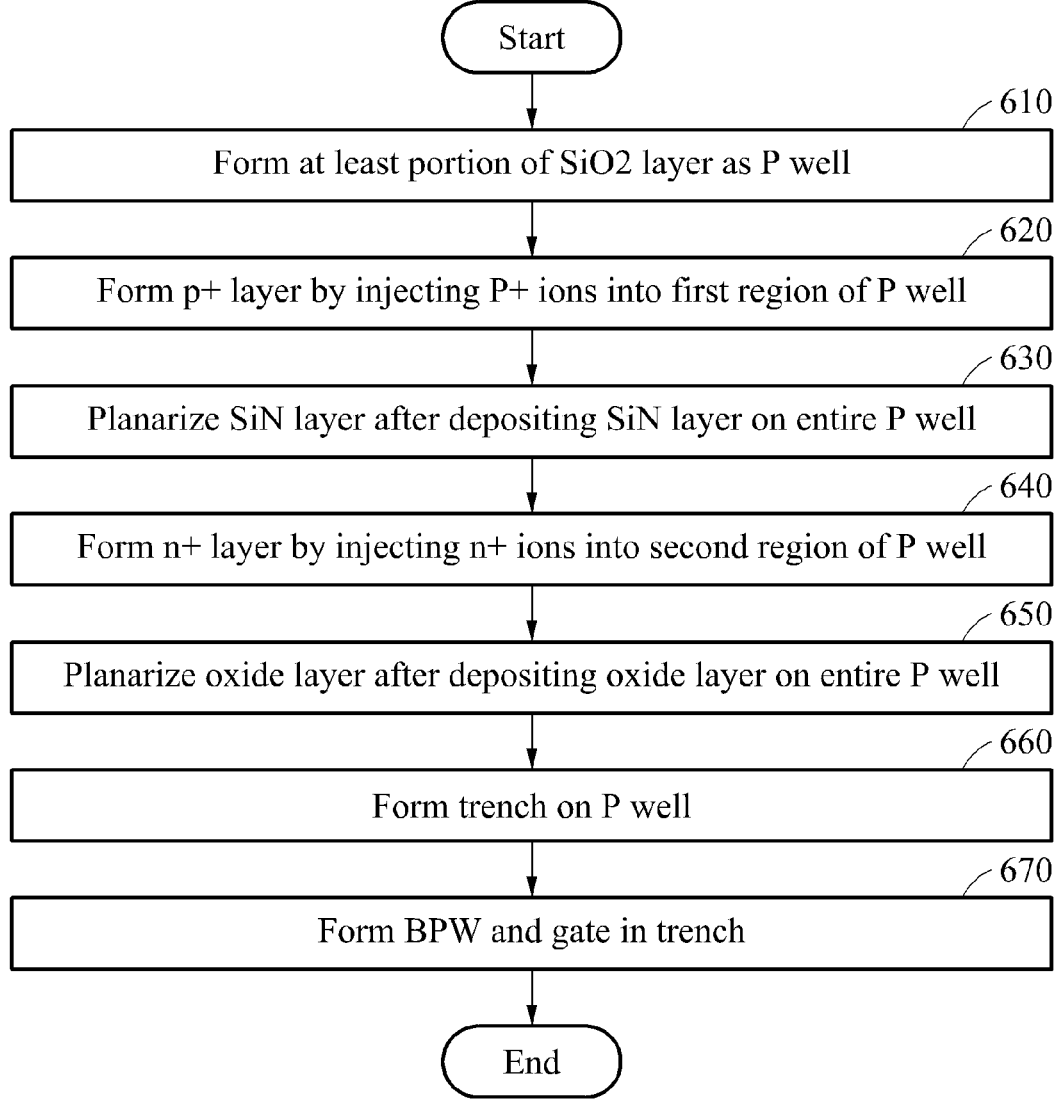
FIG. 6 is a flowchart illustrating a self-aligning processing method to reduce a critical dimension variation of a SiC trench gate MOSFET structure, according to an example embodiment.

FIG. 6 is a flowchart illustrating a self-aligning processing method to reduce a critical dimension variation of a SiC trench gate MOSFET structure, according to an example embodiment.

Firstly, in operation 610, the self-aligning processing device 100 may form at least a portion of an $SiO_2$ layer on a substrate into a P well. Operation 610 may be an operation of forming a type region by injecting p− ions on a predetermined region in a produced n type substrate.

In addition, in operation 620, the self-aligning processing device 100 may form a p+ layer by injecting P+ ions into a first region of the P well. Operation 620 may be an operation of determining a P+ active region by injecting ions into a portion of the P well to form the P+ layer. In this case, the self-aligning processing device 100 may cause the oxide layer to remain in the second region of the P well. The second region may be a region different from the first region in the P well although the second region adjoins and contacts the first region.

Subsequently, in operation 630, the self-aligning processing device 100 may deposit a SiN layer over the entire P well after forming the p+ layer. Operation 630 may be an operation of depositing the SiN layer by covering an upper end of the P well, in which the P+ layer is formed as the first region and the oxide layer is formed as the second region, with the SiN layer.

In addition, in operation 630, the self-aligning processing device 100 may prevent the oxide layer from being covered with the SiN layer by planarizing the deposited SiN layer based on the upper end of the oxide layer remaining in the second region in a process of forming the p+ layer. That is, the self-aligning processing device 100 may cause the deposited SiN layer to remain only in the first region based on the upper end of the oxide layer for planarizing the covering SiN layer.

In operation 640, the self-aligning processing device 100 may form the n+ layer by injecting n+ ions into the second region of the P well on which the SiN layer is deposited.

To form the n+ layer, the self-aligning processing device 100 may apply photoresist on the entire P well on which the SiN layer is deposited. That is, the self-aligning processing device 100 may apply photoresist to the entire upper end of the P well in which the P+ layer and the SiN layer are formed as the first region and the oxide layer is formed as the second region.

Thereafter, the self-aligning processing device 100 may form a pattern for the second region by exposure and a developer. That is, the self-aligning processing device 100 may remove photoresist applied to the second region and may pattern to expose the oxide layer.

In addition, the self-aligning processing device 100 may remove the oxide layer in the second region through a wet or dry etching process based on the pattern. That is, the self-aligning processing device 100 may etch the oxide layer in the second region and a portion of the P well under the oxide layer based on a designed pattern. In this case, wet etching may be a method of etching an oxide layer through a chemical reaction using a hydrofluoric (HF) solution. In addition, dry etching may be a method of etching an oxide layer through chemical and physical reactions using plasma.

In addition, the self-aligning processing device 100 may remove the oxide layer in the second region by a wet or dry etching process based on the pattern and may partially remove the SiN layer in the first region through a trimming process. In this case, the trimming process may be an isotropic etching process using physical and chemical reactions using a chemical reaction using a solution or plasma.

In addition, the self-aligning processing device 100 may form the n+ layer by injecting the n+ ions into the second region from which the oxide layer is removed. That is, the self-aligning processing device 100 may determine an n+ active region by injecting ions to form the n+ layer into the second region that is a different portion of the P well.

In addition, the self-aligning processing device 100 may remove the oxide layer in the second region and a portion of the SiN layer in the first region and may form the n+ layer by injecting the n+ ions. That is, the self-aligning processing device 100 may determine an n+ active region by injecting ions to form the n+ layer into a portion of the first region and the second region that is another portion of the P well.

Thereafter, the self-aligning processing device 100 may remove photoresist remaining in the first region.

Through this, the self-aligning processing device 100 may provide the P well in which the P+ layer and the SiN layer are formed as the first region and the n+ layer is formed as the second region.

In another example embodiment of forming the n+ layer, the self-aligning processing device 100 may sequentially apply an oxide layer and photoresist to the entire P well on which the SiN layer is deposited. That is, the self-aligning processing device 100 may continuously apply the oxide layer and photoresist to the entire upper end of the P well in which the P+ layer and the SiN layer are formed as the first region and the oxide layer is formed as the second region. Accordingly, in the second region, a structure in which the oxide layer remaining in the second region and an additional oxide layer are stacked in a process of forming the p+ layer may be formed.

Thereafter, the self-aligning processing device 100 may form a pattern for the second region by exposure and a developer. That is, the self-aligning processing device 100 may remove photoresist applied to the second region and may pattern to expose the oxide layer.

In addition, the self-aligning processing device 100 may remove the oxide layer in the second region through a wet or dry etching process based on the pattern. That is, the self-aligning processing device 100 may etch the stacked oxide layer in the second region and a portion of the P well under the oxide layer through a wet or dry etching process based on a designed pattern. In addition.

In addition, the self-aligning processing device 100 may remove the oxide layer in the second region by a wet or dry etching process based on the pattern and may partially remove the SiN layer in the first region through a trimming process.

In addition, the self-aligning processing device 100 may form the n+ layer by injecting the n+ ions into the second region from which the oxide layer is removed. That is, the self-aligning processing device 100 may determine an n+ active region by injecting ions to form the n+ layer into the second region that is a different portion of the P well.

In addition, the self-aligning processing device 100 may remove the oxide layer in the second region and a portion of the SiN layer in the first region and may form the n+ layer by injecting the n+ ions. That is, the self-aligning processing device 100 may determine an n+ active region by injecting ions to form the n+ layer into a portion of the first region and the second region that is another portion of the P well.

Thereafter, the self-aligning processing device 100 may remove photoresist remaining in the first region.

Through this, the self-aligning processing device 100 may provide the P well in which the P+ layer and the SiN layer are formed as the first region and the n+ layer is formed as the second region.

In addition, in operation 650, the self-aligning processing device 100 may deposit the oxide layer over the entire P well after forming the n+ layer. Operation 650 may be an operation of depositing the oxide layer by covering an upper end of the P well, in which the P+ layer and the SiN layer are formed as the first region and the oxide layer is formed as the second region, with the oxide layer.

In operation 650, the self-aligning processing device 100 may cause the oxide layer to remain on the n+ layer for the second region by planarizing the deposited oxide layer based on the upper end of the SiN layer formed in the first region. That is, the self-aligning processing device 100 may cause the deposited oxide layer to remain only in the second region based on the upper end of the SiN layer for planarizing the covering oxide layer.

Subsequently, in operation 670, the self-aligning processing device 100 may form a trench on the P well on which the oxide layer is deposited. The trench may raise a degree of integration by arranging a cell in a space formed by excavating a surface of a semiconductor chip.

To form the trench, the self-aligning processing device 100 may apply photoresist to the entire P well. That is, the self-aligning processing device 100 may apply photoresist to the entire upper end of the P well in which the P+ layer and the SiN layer are formed as the first region and the n+ layer and the oxide layer are formed as the second region.

Thereafter, the self-aligning processing device 100 may form a pattern for the first region in which the trench is formed by exposure and a developer. That is, the self-aligning processing device 100 may remove photoresist applied to a portion of the first region that is designed to include a trench and may pattern to expose the SiN layer stacked under the first region.

In addition, the self-aligning processing device 100 may form the trench by removing the SiN layer of the first region by using a wet or dry etching process based on the pattern. That is, the self-aligning processing device 100 may etch the SiN layer on a portion of the first region based on the designed pattern. In this case, wet etching may be a method of etching a SiN layer through a chemical reaction using H3PO4 (e.g., a phosphoric acid solution). In addition, dry etching may be a method of etching an SiN layer through chemical and physical reactions using plasma.

In addition, the self-aligning processing device 100 may remove the SiN layer in the first region by a wet or dry etching process based on the pattern and may partially remove the oxide layer in the second region through a trimming process. That is, the self-aligning processing device 100 may etch the SiN layer on a portion of the first region and the oxide layer on a portion of the second region based on the designed pattern. In this case, the trimming process may be an isotropic etching process using physical and chemical reactions using a chemical reaction using a solution or plasma.

Thereafter, the self-aligning processing device 100 may remove remaining photoresist.

Through this, the self-aligning processing device 100 may provide a P well in which a P+ layer including a trench in a portion of a first region is formed.

In another example embodiment of forming the trench, the self-aligning processing device 100 may sequentially apply a SiN layer and photoresist to the entire P well. That is, the self-aligning processing device 100 may continuously apply the oxide layer and photoresist to the entire upper end of the P well in which the P+ layer and the SiN layer are formed as the first region and the n+ layer and the oxide layer are formed as the second region.

Accordingly, the first region may include a structure in which the existing SiN layer covering the p+ layer and an additional SiN layer are stacked.

Thereafter, the self-aligning processing device 100 may form a pattern for the first region in which the trench is formed by exposure and a developer. That is, the self-aligning processing device 100 may remove photoresist applied to a portion of the first region that is designed to include a trench and may pattern to expose the SiN layer stacked under the first region.

In addition, the self-aligning processing device 100 may form the trench by removing the SiN layer of the first region by using a wet or dry etching process based on the pattern. That is, the self-aligning processing device 100 may etch the stacked SiN layer in the first region through a wet or dry etching process based on the designed pattern. Thereafter, the self-aligning processing device 100 may remove remaining photoresist.

In addition, in operation 670, the self-aligning processing device 100 may form a BPW and a gate. Operation 670 may be an operation of completing the SiC trench gate MOSFET by providing the BPW and the gate through the formed trench.

According to an example embodiment, a self-aligning processing method and a self-aligning processing device for reducing critical dimension variation of a SiC trench gate MOSFET structure which may significantly reduce line-width variation ($\Delta$CD) using two dielectrics of $SiO_2$ and silicon nitride (e.g., a SiN layer) may be provided.

In addition, according to an example embodiment, a self-aligning processing model using two dielectric materials having different selectivities to reduce the line-width variation ($\Delta$CD) may be provided.

Figure 7:
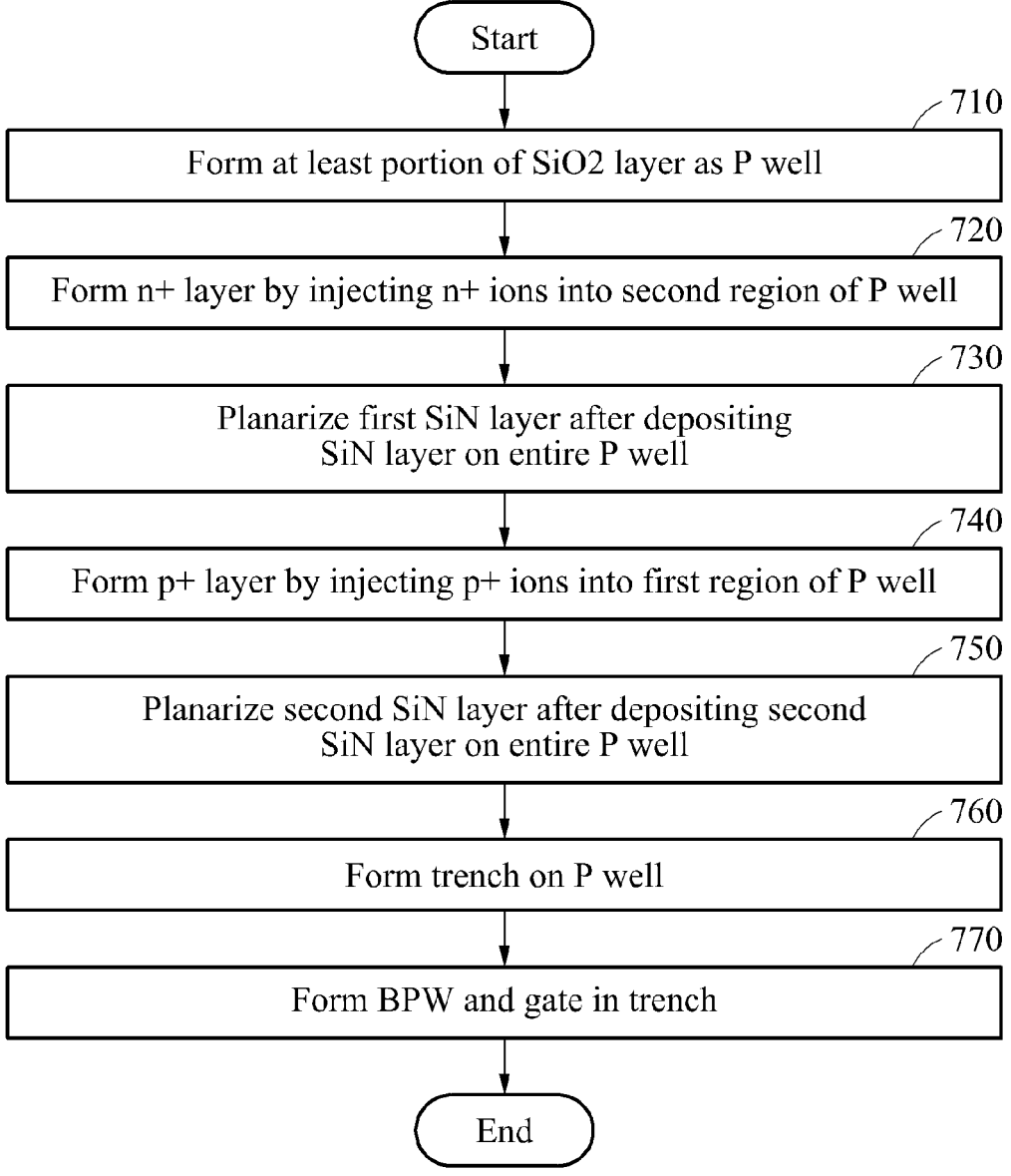
FIG. 7 is a flowchart illustrating a self-aligning processing method to reduce a critical dimension variation of a SiC trench gate MOSFET structure, according to another example embodiment.

FIG. 7 is a flowchart illustrating a self-aligning processing method to reduce a critical dimension variation of a SiC trench gate MOSFET structure, according to another example embodiment.

In operation 710, the self-aligning processing device 100 may form at least a portion of an $SiO_2$ layer on a substrate into a P well. Operation 710 may be an operation of forming a P type region by injecting p– ions on a predetermined region in a produced n type substrate.

In addition, in operation 720, the self-aligning processing device 100 may form an n+ layer by injecting n+ ions into a second region of the P well. Operation 720 may be an operation of determining an n+ active region by injecting ions into a portion of the P well to form the n+ layer. In this case, the self-aligning processing device 100 may cause the oxide layer to remain in the first region and a third region of the P well. The first region may be a region in which a P+ layer is formed, which is described below, and the third region may be a region in which a trench is formed, which is described below. The first region and the third region may adjoin and contact the second region and may be different regions in the P well.

In addition, in operation 730, the self-aligning processing device 100 may deposit a first SiN layer over the entire P well after forming the n+ layer. Operation 730 may be an operation of depositing the first SiN layer by covering the upper end of the P well, in which the oxide is formed as the first and third regions and the n+ layer is formed as the second region, with the first SiN layer.

In addition, in operation 730, the self-aligning processing device 100 may prevent the oxide layer from being covered with the first SiN layer by planarizing the deposited first SiN layer based on the upper end of the oxide layer remaining in the first region in a process of forming the n+ layer. That is, the self-aligning processing device 100 may cause the deposited first SiN layer to remain only in the second region based on the upper end of the oxide layer for planarizing the covering first SiN layer.

In operation 740, the self-aligning processing device 100 may form the p+ layer by injecting p+ ions into the first region of the P well on which the first SiN layer is deposited.

To form the p+ layer, the self-aligning processing device 100 may apply photoresist on the entire P well on which the first SiN layer is deposited. That is, the self-aligning processing device 100 may apply photoresist to the entire upper end of the P well in which the n+ layer and the first SiN layer are formed as the second region and the oxide layer is formed as the first and third regions.

Thereafter, the self-aligning processing device 100 may form a pattern for the first region by exposure and a developer. That is, the self-aligning processing device 100 may remove photoresist applied to the first region and may pattern to expose the oxide layer. In this case, the self-aligning processing device 100 may maintain the oxide layer without removing photoresist applied to the third region.

In addition, the self-aligning processing device 100 may remove the oxide layer in the first region through a wet or dry etching process based on the pattern. That is, the self-aligning processing device 100 may etch the oxide layer in the first region and a portion of the P well under the oxide layer based on a designed pattern. In this case, wet etching may be a method of etching an oxide layer through a chemical reaction using a hydrofluoric (HF) solution. In addition, dry etching may be a method of etching an oxide layer through chemical and physical reactions using plasma.

In addition, the self-aligning processing device 100 may remove the oxide layer in the first region by a wet or dry etching process based on the pattern and may partially remove the SiN layer in a portion of the first region through a trimming process. That is, the self-aligning processing device 100 may etch the oxide layer on the first region and the SiN layer on the second region based on the designed pattern.

In addition, the self-aligning processing device 100 may form the p+ layer by injecting the p+ ions into the first region from which the oxide layer is removed. That is, the self-aligning processing device 100 may determine a p+ active region by injecting ions to form the p+ layer into the first region that is a different portion of the P well.

In addition, the self-aligning processing device 100 may remove the oxide layer in the first region and a portion of the SiN layer in the second region and may form the p+ layer by injecting the p+ ions. That is, the self-aligning processing device 100 may determine the p+ active region by injecting ions to form the p+ layer into the first region that is another portion of the P well and a portion of the second region.

Thereafter, the self-aligning processing device 100 may remove photoresist remaining in the second and third regions.

Through this, the self-aligning processing device 100 may provide the P well in which the n+ layer and the first SiN layer are formed as the second region, the p+ layer is formed as the first region, and the oxide layer is formed as the third region.

In addition, in operation 750, the self-aligning processing device 100 may deposit a second SiN layer over the entire P well after forming the p+ layer. Operation 750 may be an operation of depositing the second SiN layer by covering the upper end of the P well, in which the n+ layer and the first SiN layer are formed as the second region, the p+ layer is formed as the first region, and the oxide layer is formed as the third region, with the second SiN layer.

In operation 750, the self-aligning processing device 100 may cause the second SiN layer to remain on the p+ layer for the first region by planarizing the deposited second SiN layer based on the upper end of the first SiN layer formed in the second region. That is, the self-aligning processing device 100 may cause the deposited second SiN layer to remain only in the first region based on the upper end of the first SiN layer for planarizing the covering second SiN layer.

Accordingly, the p+ layer and the second SiN layer may be formed in the first region, the n+ layer and the first SiN layer are formed in the second region, and the oxide layer is formed in the third region.

In addition, in operation 760, the self-aligning processing device 100 may form a trench in the P well on which the second SiN layer is deposited.

To form the trench, the self-aligning processing device 100 may apply photoresist to the entire P well. That is, the self-aligning processing device 100 may apply photoresist to the entire upper end of the P well in which the p+ layer and the second SiN layer are formed as the first region, the n+ layer and the first SiN layer are formed as the second region, and the oxide layer is formed as the third region.

Thereafter, the self-aligning processing device 100 may form a pattern for the third region in which the trench is formed by exposure and a developer. That is, the self-aligning processing device 100 may remove photoresist applied to a portion of the third region that is designed to include a trench and may pattern to expose the oxide layer stacked under the third region.

In addition, the self-aligning processing device 100 may form the trench by removing the oxide layer remaining in the third region by using a wet or dry etching process based on the pattern. That is, the self-aligning processing device 100 may etch the oxide layer on the third region based on the designed pattern. In this case, wet etching may be a method of etching an oxide layer through a chemical reaction using a HF solution. In addition, dry etching may be a method of etching an oxide layer through chemical and physical reactions using plasma.

In addition, the self-aligning processing device 100 may remove the oxide layer remaining in the third region by a wet or dry etching process based on the pattern and may remove the SiN layer in a portion of the second region through a trimming process. That is, the self-aligning processing device 100 may etch the oxide layer on the third region and the SiN layer on the portion of the second region based on the designed pattern.

Thereafter, the self-aligning processing device 100 may remove photoresist remaining in the first and second regions.

Through this, the self-aligning processing device 100 may provide a P well having a trench as the third region.

In addition, the self-aligning processing device 100 may provide a P well having a trench as the third region and a portion of the second region.

In addition, in operation 770, the self-aligning processing device 100 may form a BPW and a gate in the trench. That is, the self-aligning processing device 100 may complete a SiC trench gate MOSFET by providing the BPW and the gate through the formed trench.

According to an example embodiment, a self-aligning processing method and a self-aligning processing device for reducing critical dimension variation of a SiC trench gate MOSFET structure which may significantly reduce line-width variation ($\Delta$CD) using two dielectrics of $SiO_2$ and silicon nitride (e.g., a SiN layer) may be provided.

In addition, according to an example embodiment, a self-aligning processing model using two dielectric materials having different selectivities to reduce the line-width variation ($\Delta$CD) may be provided.

The methods according to the above-described examples may be recorded in non-transitory computer-readable media including program instructions to implement various operations of the above-described examples. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape, optical media such as CD-ROM discs, DVDs, and/or Blue-ray discs, magneto-optical media such as optical discs, and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher-level code that may be executed by the computer using an interpreter. The above-described devices may be configured to act as one or more software modules in order to perform the operations of the above-described example embodiments, or vice versa.

The software may include a computer program, a piece of code, an instruction, or some combination thereof, to independently or uniformly instruct or configure the processing device to operate as desired. Software and data may be embodied permanently or temporarily in any type of machine, component, physical or pseudo equipment, computer storage medium or device, or in a propagated signal wave capable of providing instructions or data to or being interpreted by the processing device. The software also may be to distributed over network-coupled computer systems so that the software is stored and executed in a distributed fashion. The software and data may be stored by one or more non-transitory computer-readable recording mediums.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

The invention claimed is:

1. A self-aligning processing method of reducing critical dimension variation of a SiC trench gate metal-oxide-semiconductor field-effect transistor (MOSFET) structure, the self-aligning processing method comprising:

forming at least a portion of a SiO2 layer on a substrate as a P well;

forming a p+ layer by injecting P+ ions into a first region of the P well;

after forming the p+ layer, planarizing a SiN layer after depositing the SiN layer on an entirety of the P well;

forming an n+ layer by injecting n+ ions into a second region of the P well on which the SiN layer is deposited;

after forming the n+ layer, planarizing an oxide layer after depositing the oxide layer on the entirety of the P well;

forming a trench on the P well on which the oxide layer is deposited; and forming a bottom protection well and a gate in the trench, wherein the planarizing of the oxide layer after depositing comprises causing the oxide layer to remain on the n+ layer for the second region by planarizing the deposited oxide layer based on an upper end of the SiN layer formed in the first region.

2. The self-aligning processing method of claim 1, wherein the planarizing of the SiN layer after depositing comprises preventing the oxide layer from being covered with the SiN layer by planarizing the deposited SiN layer based on an upper end of the oxide layer remaining in the second region while forming the p+ layer.

3. The self-aligning processing method of claim 2, wherein the forming of the n+ layer comprises:

applying photoresist to the entirety of the P well on which the SiN layer is deposited;

forming a pattern by exposure and a developer for the second region;

removing the oxide layer of the second region by wet or dry etching based on the pattern; and removing the photoresist after forming the n+ layer by injecting the n+ ions into the second region from which the oxide layer is removed.

4. The self-aligning processing method of claim 2, wherein the forming of the n+ layer comprises:

sequentially applying an oxide layer and photoresist to the entirety of the P well on which the SiN layer is deposited;

forming a pattern by exposure and a developer for the second region;

removing the oxide layer of the second region by wet or dry etching based on the pattern; and removing the photoresist after forming the n+ layer by injecting the n+ ions into the second region from which the oxide layer is removed.

5. The self-aligning processing method of claim 1, wherein the forming of the trench comprises:

applying photoresist on the entirety of the P well;

forming a pattern by exposure and a developer for the first region in which the trench is formed; and forming the trench by removing the SiN layer of the first region by wet or dry etching based on the pattern.

6. The self-aligning processing method of claim 1, wherein the forming of the trench comprises:

sequentially applying a SiN layer and photoresist to the entirety of the P well;

forming a pattern by exposure and a developer for the first region in which the trench is formed; and removing the photoresist after forming the trench by removing the SiN layer of the first region by wet or dry etching based on the pattern.

7. A non-transitory computer-readable storage medium storing instructions that, when executed by a processor, cause the processor to perform the method of claim 1.

8. A self-aligning processing method of reducing critical dimension variation of a SiC trench gate metal-oxide-semiconductor field-effect transistor (MOSFET) structure, the self-aligning processing method comprising:

forming at least a portion of a SiO2 layer on a substrate as a P well;

forming an n+ layer by injecting n+ ions into a second region of the P well;

after forming the n+ layer, planarizing a first SiN layer after depositing the first SiN layer on an entirety of the P well;

forming a p+ layer by injecting p+ ions into a first region of the P well on which the first SiN layer is deposited;

after forming the p+ layer, planarizing a second SiN layer after depositing the second SiN layer on the entirety of the P well;

after forming a trench in the P well on which the second SiN layer is deposited, removing photoresist; and forming a bottom protection well (BPW) and a gate in the trench, wherein the planarizing of the second SiN layer after depositing comprises causing the second SiN layer to remain on the p+ layer for the first region by planarizing the deposited second SiN layer based on an upper end of the first SiN layer formed in the second region.

9. The self-aligning processing method of claim 8, wherein the planarizing of the first SiN layer after depositing comprises preventing an oxide layer from being covered with the first SiN layer by planarizing the deposited first SiN layer based on an upper end of the oxide layer remaining in the first region while forming the n+ layer.

10. The self-aligning processing method of claim 9, wherein the forming of the p+ layer comprises:

applying photoresist to the entirety of the P well on which the first SiN layer is deposited;

forming a pattern by exposure and a developer for the first region;

removing the oxide layer of the first region by a wet or dry etching process based on the pattern; and removing the photoresist after forming the p+ layer by injecting the p+ ions into the first region from which the oxide layer is removed.

11. The self-aligning processing method of claim 8, wherein the forming of the trench comprises:

applying photoresist on the entirety of the P well;

forming a pattern by exposure and a developer for a third region in which the trench is formed; and forming the trench by removing the oxide layer remaining in the third region by a wet or dry etching based on the pattern.

12. A self-aligning processing device for reducing critical dimension variation of a SiC trench gate metal-oxide-semiconductor field-effect transistor (MOSFET) structure, the self-aligning processing device comprising:

a forming unit configured to form at least a portion of a $SiO_2$ layer on a substrate as a P well and form a p+ layer by injecting P+ ions into a first region of the P well;

a deposition unit configured to planarize a SiN layer after depositing the SiN layer on an entirety of the P well after forming the p+ layer, wherein the forming unit is configured to:

form an n+ layer by injecting n+ ions into a second region of the P well on which the SiN layer is deposited, and as the deposition unit planarizes an oxide layer after depositing the oxide layer on the entirety of the P well after forming the n+ layer, form a trench in the P well on which the oxide layer is deposited and form a bottom protection well (BPW) and a gate in the trench, wherein the deposition unit is configured to cause the oxide layer to remain on the n+ layer for the second region by planarizing the deposited oxide layer based on an upper end of the SiN layer formed in the first region.

13. The self-aligning processing device of claim 12, wherein the deposition unit is configured to prevent the oxide layer from being covered with the SiN layer by planarizing the deposited SiN layer based on an upper end of the oxide layer remaining in the second region while forming the p+ layer.

14. A self-aligning processing device for reducing critical dimension variation of a SiC trench gate metal-oxide-semiconductor field-effect transistor (MOSFET) structure, the self-aligning processing device comprising:

a forming unit configured to form at least a portion of a $SiO_2$ layer on a substrate as a P well and form an n+ layer by injecting n+ ions into a second region of the P well;

a deposition unit configured to planarize a first SiN layer after depositing the first SiN layer on an entirety of the P well after forming the n+ layer, wherein the forming unit is configured to:

form a p+ layer by injecting p+ ions into a first region of the P well on which the first SiN layer is deposited, and as the deposition unit planarizes a second SiN layer after depositing the second SiN layer on the entirety of the P well after forming the p+ layer, form a trench in the P well on which the second SiN layer is deposited and form a bottom protection well (BPW) and a gate in the trench, wherein the deposition unit is further configured to planarize the second SiN layer such that the second SiN layer remains on the p+ layer of the first region by planarizing the deposited second SiN layer based on an upper end of the first SiN layer formed in the second region.

* * * * *